(12) United States Patent
Asirvatham

(10) Patent No.: US 11,999,890 B2
(45) Date of Patent: Jun. 4, 2024

(54) SURFACTANTS FOR ELECTRONICS

(71) Applicant: AdvanSix Resins & Chemicals LLC, Parsippany, NJ (US)

(72) Inventor: Edward Asirvatham, Chatham, NJ (US)

(73) Assignee: AdvanSix Resins and Chemicals LLC, Parsippany, NJ (US)

( * ) Notice: Subject to any disclaimer, the term of this patent is extended or adjusted under 35 U.S.C. 154(b) by 19 days.

(21) Appl. No.: 17/871,208

(22) Filed: Jul. 22, 2022

(65) Prior Publication Data

US 2022/0380669 A1 Dec. 1, 2022

Related U.S. Application Data

(62) Division of application No. 17/127,048, filed on Dec. 18, 2020.

(60) Provisional application No. 62/970,356, filed on Feb. 5, 2020.

(51) Int. Cl.
*C09K 13/06* (2006.01)
*C07F 7/08* (2006.01)
*C09K 13/00* (2006.01)

(52) U.S. Cl.
CPC ............ *C09K 13/06* (2013.01); *C07F 7/0838* (2013.01); *C09K 13/00* (2013.01)

(58) Field of Classification Search
None
See application file for complete search history.

(56) References Cited

U.S. PATENT DOCUMENTS

| | | | |
|---|---|---|---|
| 11,427,760 B2 * | 8/2022 | Asirvatham | H01L 31/02363 |
| 11,525,105 B2 * | 12/2022 | Asirvatham | C11D 3/3757 |
| 2007/0142583 A1 * | 6/2007 | Schorzman | C08F 230/08 526/279 |
| 2008/0152540 A1 * | 6/2008 | Schorzman | B65B 25/008 422/40 |
| 2021/0186842 A1 * | 6/2021 | Asirvatham | A61Q 11/00 |
| 2021/0187460 A1 * | 6/2021 | Asirvatham | C09D 11/033 |
| 2021/0188882 A1 * | 6/2021 | Asirvatham | A01N 25/30 |
| 2021/0189292 A1 * | 6/2021 | Asirvatham | C11D 1/00 |
| 2021/0198555 A1 * | 7/2021 | Asirvatham | E21B 43/16 |

FOREIGN PATENT DOCUMENTS

EP 2821429 A1 * 1/2015 ............. A61K 8/898

\* cited by examiner

*Primary Examiner* — Allan W. Olsen
(74) *Attorney, Agent, or Firm* — Faegre Drinker Biddle & Reath LLP

(57) ABSTRACT

Pre-texturing agents, etchants, and photoresist stripping agents may be formulated to include one or more surfactants, from one or more surfactant classes, such as siloxane derivatives of amino acids that have surface-active properties.

19 Claims, 7 Drawing Sheets

SURFACTANTS FOR ELECTRONICS

CROSS-REFERENCE TO RELATED APPLICATION

This application is a Divisional Application of U.S. patent application Ser. No. 17/127,048, filed Dec. 18, 2020, which claims priority to U.S. Provisional Application No. 62/970,356, filed Feb. 5, 2020, the disclosures of which are herein incorporated by reference in their entireties.

FIELD

The present disclosure pertains to surfactants for use in electronics. More specifically, the present disclosure pertains to surfactants in preparing circuit boards through etching and removing photoresist coatings. Such surfactants may include siloxane derivatives of amino acids wherein the siloxane derivatives have surface-active properties.

BACKGROUND

Surfactants (molecules with surface-active properties) are widely used in manufacturing circuit boards in cleaners, etchants, and photoresist strippers. The surfactants may be included as emulsifiers, wetting agents, foaming agents, dispersants, and/or agents to improve spreadability.

The surfactants may be uncharged, zwitterionic, cationic, or anionic. Although in principle any surfactant class (e.g., cationic, anionic, nonionic, amphoteric) is suitable, it is possible that a formulation may include a combination of two or more surfactants from two or more surfactant classes.

Often, surfactants are amphiphilic molecules with a relatively water-insoluble hydrophobic "tail" group and a relatively water-soluble hydrophilic "head" group. These compounds may adsorb at an interface, such as an interface between two liquids, a liquid and a gas, or a liquid and a solid. In systems comprising relatively polar and relatively non-polar components the hydrophobic tail preferentially interacts with the relatively non-polar component(s) while the hydrophilic head preferentially interacts with the relatively polar component(s). In the case of an interface between water and oil, the hydrophilic head group preferentially extends into the water, while the hydrophobic tail preferentially extends into the oil. When added to a water-gas interface, the hydrophilic head group preferentially extends into the water, while the hydrophobic tail preferentially extends into the gas. The presence of the surfactant disrupts at least some of the intermolecular interaction between the water molecules, replacing at least some of the interactions between water molecules with generally weaker interactions between at least some of the water molecules and the surfactant. This results in lowered surface tension and can also serve to stabilize the interface.

At sufficiently high concentrations, surfactants may form aggregates which serve to limit the exposure of the hydrophobic tail to the polar solvent. One such aggregate is a micelle. In a typical micelle the molecules are arranged in a sphere with the hydrophobic tails of the surfactant(s) preferentially located inside the sphere and the hydrophilic heads of the surfactant(s) preferentially located on the outside of the micelle where the heads preferentially interact with the more polar solvent. The effect that a given compound has on surface tension and the concentration at which it forms micelles may serve as defining characteristics for a surfactant.

SUMMARY

The present disclosure provides formulations for use in pre-texturing agents, etchants, and photoresist strippers. These products may be formulated to include one or more surfactants from one or more surfactant classes disclosed herein. The surfactants may be used as emulsifiers, wetting agents, dispersants, and/or agents to improve spreadability.

The present disclosure provides surfactants for pre-texturing agents, etchants, and photoresist strippers in the form of siloxane derivatives of amino acids that have surface-active properties. The amino acids may be naturally occurring or synthetic amino acids, or they may be obtained via ring-opening reactions of molecules such as lactams, for instance caprolactam. The amino acids may be functionalized with different types of siloxane groups to form compounds with surface-active properties. Characteristically, these compounds may have low critical micelle concentrations (CMC) and/or the ability to reduce the surface tension of a liquid.

The present disclosure provides a formulation for a pre-texturing agent, comprising at least one surfactant of Formula I,

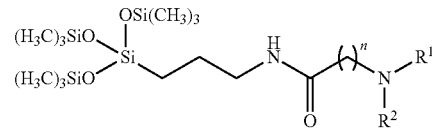

Formula I wherein $R^1$ and $R^2$ may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate; n is an integer from 1 to 12; the terminal nitrogen is optionally further substituted with $R^3$, wherein $R^3$ is selected from the group consisting of hydrogen, oxygen, hydroxyl, and $C_1$-$C_6$ alkyl; an optional counterion associated with the compound which, if present, is selected from the group consisting of chloride, bromide, and iodide; one or more defoaming agents, optionally one or more acids, optionally one or more bases, optionally one or more chelating agents, and one or more solvents.

The present disclosure further provides a formulation for an etchant, comprising at least one surfactant of Formula I,

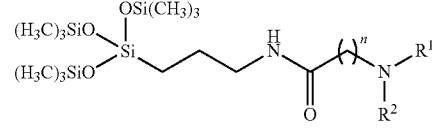

Formula I wherein $R^1$ and $R^2$ may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate; n is an integer from 1 to 12;

the terminal nitrogen is optionally further substituted with $R^3$, wherein $R^3$ is selected from the group consisting of hydrogen, oxygen, hydroxyl, and $C_1$-$C_6$ alkyl; an optional counterion associated with the compound which, if present, is selected from the group consisting of chloride, bromide, and iodide; hydrofluoric acid (HF), one or more solvents, optionally one or more oxidizing agents, and one or more complexing agents.

The present disclosure also provides a formulation for a photoresist stripper, comprising at least one surfactant of Formula I,

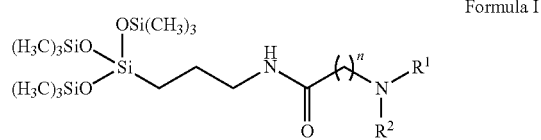

Formula I wherein $R^1$ and $R^2$ may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate; n is an integer from 1 to 12; the terminal nitrogen is optionally further substituted with $R^3$, wherein $R^3$ is selected from the group consisting of hydrogen, oxygen, hydroxyl, and $C_1$-$C_6$ alkyl; an optional counterion associated with the compound which, if present, is selected from the group consisting of chloride, bromide, and iodide; an alkanolamine; a sulfoxide or sulfone compound; and a glycol ether.

The above mentioned and other features of the disclosure, and the manner of attaining them, will become more apparent and will be better understood by reference to the following description of embodiments taken in conjunction with the accompanying drawings.

DETAILED DESCRIPTION

Figure 1:
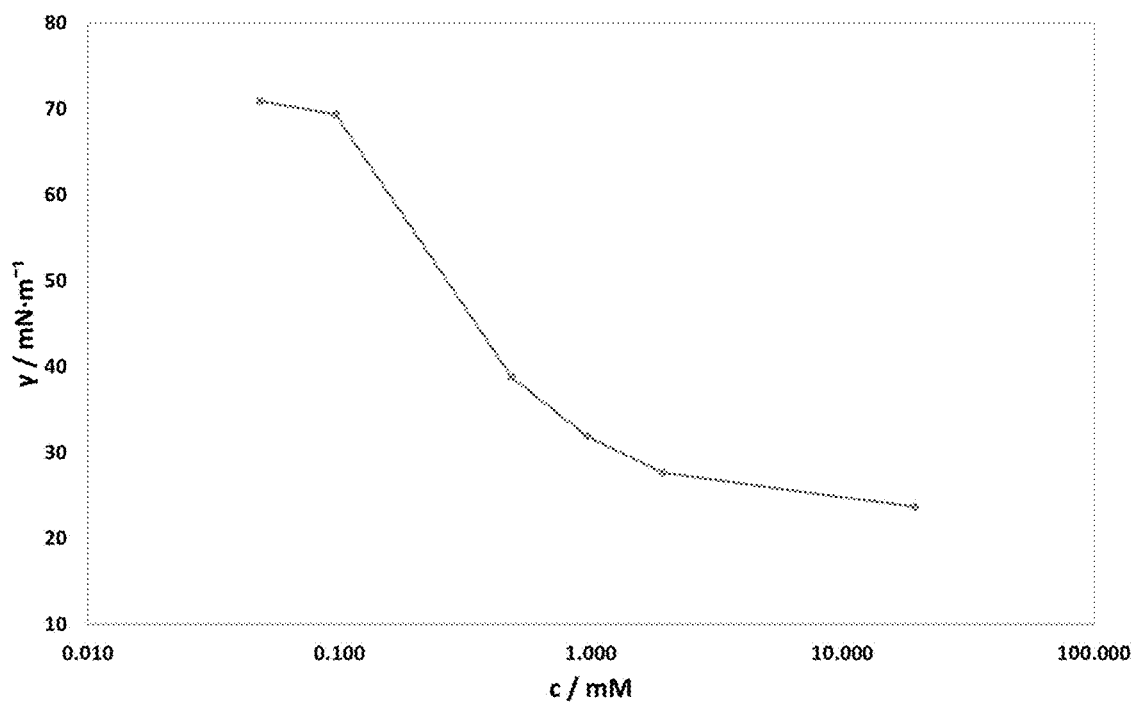
FIG. 1 shows a plot of surface tension versus concentration for Surfactant 2, with a chloride counterion measured at pH=7 as described in Example 1 b.

As used herein, the phrase "within any range using these endpoints" literally means that any range may be selected from any two of the values listed prior to such phrase regardless of whether the values are in the lower part of the listing or in the higher part of the listing. For example, a pair of values may be selected from two lower values, two higher values, or a lower value and a higher value.

As used herein, the word "alkyl" means any saturated carbon chain, which may be a straight or branched chain.

As used herein, the phrase "surface-active" means that the associated compound is able to lower the surface tension of the medium in which it is at least partially dissolved, and/or the interfacial tension with other phases, and, accordingly, may be at least partially adsorbed at the liquid/vapor and/or other interfaces. The term "surfactant" may be applied to such a compound.

With respect to the terminology of inexactitude, the terms "about" and "approximately" may be used, interchangeably, to refer to a measurement that includes the stated measurement and that also includes any measurements that are reasonably close to the stated measurement. Measurements that are reasonably close to the stated measurement deviate from the stated measurement by a reasonably small amount as understood and readily ascertained by individuals having ordinary skill in the relevant arts. Such deviations may be attributable to measurement error or minor adjustments made to optimize performance, for example. In the event it is determined that individuals having ordinary skill in the relevant arts would not readily ascertain values for such reasonably small differences, the terms "about" and "approximately" can be understood to mean plus or minus 10% of the stated value.

The present disclosure provides formulations of pre-texturing agents, etchants, and photoresist strippers.

I. Pre-Texturing Agent

The present disclosure provides formulations and methods for texturing of a surface of a photovoltaic wafer. For improving the efficiency of conversion of light energy to electricity, a very low reflecting silicon surface is desired. For monocrystalline silicon for example, this is achieved by anisotropic etching of (100) Si wafers to form pyramid structures on the surface, in a process called as texturing. A uniform and dense distribution of pyramids is desired on the surface of the silicon wafer to achieve low reflectance. It is desired that the pyramid heights be less than 10 μm and be uniform in size. Smaller and uniform pyramid structures ensure good coverage by the passivation layer which is deposited on the top of the textured surface again to prevent losses in efficiency. Smaller and uniform pyramid structures also ensure that metal contact lines printed on the silicon surface are narrower, allowing more light to pass through to the silicon surface for the photo-electron conversion.

The pre-texturing formulations of the present disclosure may be used to treat silicon wafers, substrates, or silicon films deposited on a different type of substrates (the terms substrate or wafer are used interchangeably herein) in the texturing processes described herein. The silicon wafers treated with pre-texturing formulation and/or the methods of the present disclosure may be used to make photovoltaic cells. Wafers subjected to the pre-texturing formulation and/or methods of the present disclosure may show improvement in the texturing uniformity and reduced reflectivity compared to the wafers not subjected to this treatment.

Additional benefits that may be achieved with the method and/or formulation of the present disclosure may include one or more of the following: 1) the creation of pyramid structures on the surface of the wafer having high density and having an average height less than 10 μm, or less than 8 μm or less than 5 μm or less than 4 μm; 2) decreased reflectance of the textured surface; 3) decreased time needed to form pyramids and/or form the textured surface with low reflectance; 4) lower sensitivity of texturing quality to isopropyl alcohol concentration in the texturing process and in some embodiments texturing may be performed without any isopropyl alcohol or any other additive needed to promote texturing in the one or more texturing compositions; 5) when the pre-texturing formulation and/or method of the present disclosure is used in the texturing process, the need for additives in the texturing (etching) composition or etching solution to improve quality and throughput of texturing may be reduced or eliminated; 6) the total amount of silicon etched in the texturing step may be reduced; 7) the bath life of the texturing composition (also referred to as texturing or etching solution) may be increased; 8) coverage of passivation layer may be improved; 9) the metal contact lines printed on the front of the wafer may be narrower; and 10) the wettability of the silicon surface prior to texturing may be increased.

Pre-texturing using the pre-texturing formulations of the present disclosure, as well as the methods of texturing described herein, may reduce the time for texturing as compared to known methods and formulations. This may result in decreased processing time therefore increased throughput for the wafer processing. Furthermore, when the pre-texturing formulations and/or methods of the present disclosure are used, may change little with time or show little sensitivity to the concentrations of the one or more texturing compositions in the one or more texturing baths during the texturing process, thus resulting in improvements in the robustness of the process; therefore longer or shorter texturing times may be used, if there is a process upset, without detriment to performance of the photovoltaic device.

Photovoltaic mono-crystalline silicon wafer processing typically involves a first step or steps of cleaning to remove any contamination and removing saw damage of the cut wafers (cut from ingots) typically in concentrated alkali solutions, followed by texturing in dilute alkaline solutions to generate pyramid texture on the surface, which reduces the reflectivity of the surface and allows more light to be converted to electricity thereby increasing the efficiency of the wafer. For multicrystalline silicon wafers processing may involve first step or steps of cleaning to remove any contamination directly followed by texturing. It is desirable to have as low reflectivity as possible. The present disclosure provides pre-texturing formulations and methods to improve the texturing of the surface of the wafer. The present disclosure provides methods to treat the wafer surface with a pre-texturing formulation that comprises one or more surfactants or one or more surfactants in a solution. The formulation modifies the wafer surface and results in high nucleation density of pyramids in the case of texturing monocrystalline silicon wafers, resulting in a desired uniform distribution of small pyramids. For multicrystalline silicon wafers the surface modification improves the uniformity of the textured surface and can result in lower surface reflectivity.

The pre-texturing formulations provided by the present disclosure may include one or more surfactants chosen from one or more surfactant classes, one or more defoaming agents, optionally one or more acids, optionally one or more bases, optionally one or more chelating agents, and one or more solvents.

1. Surfactant

The pre-texturing agents of the present disclosure comprise one or more surfactants, also referred to as the surfactant system. The choice of the one or more surfactants may depend upon its or their ability to modify the wafer surface to nucleate the pyramids and clean the surface of the wafer.

Suitable surfactants for use in the pre-texturing formulation of the present disclosure include one or more surfactants and/or co-surfactants of Formula I,

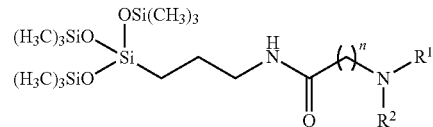

Formula I wherein $R^1$ and $R^2$ may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate; n is an integer from 1 to 12; the terminal nitrogen is optionally further substituted with $R^3$, wherein $R^3$ is selected from the group consisting of hydrogen, oxygen, hydroxyl, and $C_1$-$C_6$ alkyl; and an optional counterion associated with the compound which, if present, is selected from the group consisting of chloride, bromide, and iodide.

In particular, suitable surfactants or co-surfactants may include one or more of any of Surfactants 1-6 described herein.

The amount of the surfactant system in the pre-texturing formulation may range from about 0.01 wt. % or greater, about 0.1 wt. % or greater, about 1 wt. % or greater, about 5 wt. % or greater, about 10 wt. % or greater, about 15 wt. % or greater, or about 20 wt. % or lower, about 25 wt. % or lower, about 30 wt. % or lower, or within any range using these endpoints.

2. Defoaming Agents

The pre-texturing formulations of the present disclosure may further comprise one or more defoaming agents/anti-foaming agents. The defoaming agents may be selected from, but not limited to: silicones, organic phosphates, ethylene oxide/propylene oxide (EO/PO) based defoamers containing polyethylene glycol and polypropylene glycol copolymers, alcohols, white oils or vegetable oils and the waxes are long chain fatty alcohol, fatty acid soaps or esters. Some agents, such as some silicone surfactants and the surfactants of the present disclosure, may function as both defoaming agent and surfactant.

The defoaming agents may be present in the pre-texturing formulations in an amount ranging from about 0.0001 wt. % or greater, about 0.001 wt. % or greater, about 0.01 wt. % or greater, about 0.1 wt. % or greater, about 0.2 wt. % or greater, about 0.5 wt. % or greater, or about 1.0 wt. % or lower, about 1.5 wt. % or lower, about 2.0 wt. % or lower, about 3.0 wt. % or lower, about 3.5 wt. % or lower, about 4.0 wt. % or lower, about 4.5 wt. % or lower, about 5.0 wt. % or lower, or within any range using these endpoints.

3. Acid

Organic acids function to improve the removal of trace metals, organic and inorganic residues. Organic acids may be chosen from a broad range of acids, including but not limited to: oxalic acid, citric acid, maliec acid, malic acid, malonic acid, gluconic acid, glutaric acid, ascorbic acid, formic acid, acetic acid, ethylene diamine tetraacetic acid, diethylene triamine pentaacetic acid, glycine, alanine, cystine, sulfonic acid, various derivatives of sulfonic acid, or mixtures thereof. Salts of these acids may also be used. A mixture of these acids/salts may be used as well.

The pre-texturing formulation may further include inorganic acids and/or their salts. The inorganic acids and/or their salts may be used in combination with other organic acids and/or their salts. Suitable inorganic acids include hydrochloric acid, nitric acid, sulfuric acid, phosphoric acid, hydrofluoric acid, sulfamic acid, etc. A mixture of these acids/salts may be used as well.

The pre-texturing compositions the present disclosure may include amounts of acids and/or their salts (acids/salts) of about 0 wt. % or greater, about 0.1 wt. % or greater, about 5 wt. % or greater, about 10 wt. % or greater, or about 15 wt. % or lower, about 20 wt. % or lower, about 25 wt. % or lower, about 30 wt. % or lower, or within any range using these endpoints.

A combination of acids and salts may also be used to buffer the solution at the desired pH level. When the acids/salts are added to pre-texturing formulations, they may be present in amounts of about 0.2 wt. % or greater, about 0.3 wt. % or greater, about 0.5 wt. % or greater, about 1 wt. % or greater, about 3 wt. % or greater, or about 5 wt. % or lower, about 7 wt. % or lower, about 9 wt. % or lower, about 10 wt. % or lower, or within any range using these endpoints.

4. Base

The pre-texturing formulations of the present disclosure may further comprise one or more bases. Suitable bases include, but are not limited to: ammonium hydroxide, potassium hydroxide, a quaternary ammonium hydroxide, an amine, guanidine carbonate, and organic bases. The bases may be used either alone or in combination with other bases. Examples of suitable organic bases include, but are not limited to: hydroxylamines, ethylene glycol, glycerol, organic amines such as primary, secondary or tertiary aliphatic amines, alicyclic amines, aromatic amines and heterocyclic amines, aqueous ammonia, and quaternary ammonium hydroxides, such as hydroxylamine ($NH_2OH$), N-methylhydroxylamine, N,N-dimethylhydroxylamine, N,N-diethylhydroxylamine, monoethanolamine, ethylenediamine, 2-(2-aminoethylamino)ethanol, diethanolamine, N-methylaminoethanol, dipropylamine, 2-ethylaminoethanol, dimethylaminoethanol, ethyldiethanolamine, cyclohexylamine, dicyclohexylamine, benzylamine, dibenzylamine, N-methylbenzylamine, pyrrole, pyrrolidine, pyrrolidone, pyridine, morpholine, pyrazine, piperidine, N-hydroxyethylpiperidine, oxazole, thiazole, tetramethylammonium hydroxide (TMAH), tetraethylammonium hydroxide, tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, and (1-hydroxypropyl)trimethylammonium hydroxide.

The pre-texturing formulations may include bases in an amount ranging from about 0 wt. % or greater, about 1 wt. % or greater, about 5 wt. % or greater, or about 10 wt. % or lower, about 15 wt. % or lower, about 20 wt. % or lower, or within any range using these endpoints.

The pH of the pre-texturing formulations may also be controlled by adjusting the concentrations of acids and bases. pH may be a factor for controlling surfactant adsorption on the surface of the substrate and thereby the quality of the resulting texturing in the texturing step.

5. Optional Chelating Agent

The pre-texturing and/or texturing compositions of this invention may further comprise one or more chelating agents. The chelating agents may be selected from, but not limited to: ethylenediaminetetracetic acid (EDTA), N-hydroxyethylethylenediaminetriacetic acid (NHEDTA), nitrilotriacetic acid (NTA), diethylklenetriaminepentaceticdiethylenetriaminepentaacetic acid (DPTA), ethanoldiglycinate, citric acid, gluconic acid, oxalic acid, phosphoric acid, tartaric acid, methyldiphosphonic acid, aminotrismethylenephosphonic acid, ethylidene-diphosphonic acid, 1-hydroxyethylidene-1,1-diphosphonic acid, 1-hydroxypropylidene-1,1-diphosphonic acid, ethylaminobismethylenephosphonic acid, dodecylaminobismethylenephosphonic acid, nitrilotrismethylenephosphonic acid, ethylenediaminebismethylenephosphonic acid, ethylenediaminetetrakismethylenephosphonic acid, hexadiaminetetrakismethylenephosphonic acid, diethylenetriaminepentamethylenephosphonic acid and 1,2-propanediaminetetetamethylenephosphonic acid or ammonium salts, organic amine salts, maronic acid, succinic acid, dimercapto succinic acid, glutaric acid, maleic acid, phthalic acid, fumaric acid, polycarboxylic acids such as tricarbaryl acid, propane-1,1,2,3-tetracarboxylic acid, butane-1,2,3,4-tetracarboxylic acid, pyromellitic acid, oxycarboxylic acids such as glycolic acid, β-hydroxypropionic acid, citric acid, malic acid, tartaric acid, pyruvic acid, diglycol acid, salicylic acid, gallic acid, polyphenols such as catechol, pyrogallol, phosphoric acids such as pyrophosphoric acid, polyphosphoric acid, heterocyclic compounds such as 8-oxyquinoline, and diketones such as α-dipyridyl acetylacetone.

The pre-texturing formulations of the present disclosure may include chelating agents in an amount of about 0 wt. % or greater, about 1 wt. % or greater, about 2 wt. % or greater, about 3 wt. % or greater, about 4 wt. % or greater, about 5 wt. % or greater, or about 6 wt. % or lower, about 7 wt. % or lower, about 8 wt. % or lower, about 9 wt. % or lower, about 10 wt. % or lower, or within any range using these endpoints.

6. Solvents

The pre-formulation may be an aqueous composition comprising water as a solvent, such as water, DI water or purified water; however, it is possible to use ordinary solvents instead of or in addition to water, including alcohols, glycols, acetone and the like as known to a person of skill in the art. The pre-texturing formulations may comprise greater than 50 wt. % water based on the total weight of the formulations.

7. Other Additives

The pre-texturing composition comprising surfactant may also comprise one or more additives to promote cleaning and/or texturing (etching) of the wafer surface. Cleaning additives would help remove debris remaining on the surface even after a saw damage removal step, for example, if any. Optionally the pre-texturing composition of this invention may comprise one or more additional components including inorganic or organic acids, bases, chelating agents, dispersants and defoaming agents or mixtures thereof. Acids and bases and other additives may be added to the pre-texturing composition for example to improve its cleaning performance.

The pre-texturing formulations of the present disclosure may further comprise one or more dispersing agents. Suitable dispersing agents include the surfactants or the present disclosure, as well as triethanolamine laurylsulfate, ammonium laurylsulfate, polyoxyethylene alkyl ether triethanolamine sulfate, acrylamide-methyl-propane sulfonates, polyoxyethylene lauryl ether, polyoxyethylene cetyl ether, polyoxyethylene stearic ether, polyoxyethylene oleyl ether, polyoxyethylene higher alcohol ether, polyoxyethylene octyl phenyl ether, polyoxyethylene nonyl phenyl ether, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbit tetraoleate, polyethylene glycol monolaurate, polyethylene glycol monostearate, polyethylene glycol distearate, polyethylene glycol monooleate, polyoxyethylene alkylamine, polyoxyethylene hardened castor oil, alkylalkanolamide, polyvinylpyrrolidone, coconutamine acetate, stearylamine acetate, laurylbetaine, stearylbetaine, lauryldimethylamine oxide, and 2-alkyl-N-carboxymethyl-N-hydroxyethylimidazolinium betaine.

The dispersing agents may be present in the pre-texturing formulation in an amount of about 0 wt. % or greater, about 0.1 wt. % or greater, about 0.5 wt. % or greater, about 1.0 wt. % or greater, about 1.5 wt. % or greater, or about 2.0 wt. % or lower, about 2.5 wt. % or lower, about 3.0 wt. % or lower, about 3.5 wt. % or lower, about 4.0 wt. % or lower, about 4.5 wt. % or lower, about 5.0 wt. % or lower, or within any range using these endpoints.

The pre-texturing formulations may further include other additives, such as sugar or sugar alcohol, such as xylitol, mannose, glucose and the like. The pre-texturing formulations may contain these additives in amounts of about 0 wt. % or greater, about 1 wt. % or greater, about 10 wt. % or greater, about 20 wt. % or greater, or about 30 wt. % or lower, about 40 wt. % or lower, about 50 wt. % or lower, or within any range using these endpoints.

The pre-texturing formulation may also include oxidizing agents such as nitric acid, peroxides, and hypochlorites. The oxidizing agents may be present in amounts of about 0 wt. % or greater, about 1 wt. % or greater, about 10 wt. % or greater, about 20 wt. % or greater, or about 30 wt. % or lower, about 40 wt. % or lower, about 50 wt. % or lower, or within any range using these endpoints.

The pre-texturing formulations may also include corrosion inhibitors to protect the process equipment material from corrosion resulting from exposure to the pre-texture treatment compositions or texturing etching compositions.

Suitable corrosion inhibitors may include compounds such as 1,2,4 triazole, amino triazole, benzotriazole, tolytriazole, mercaptobenzothiazole. The formulations may also include corrosion inhibitors such as ascorbic acid which are chemically reducing in nature.

8. Method of Use

The pre-texturing formulations of the present disclosure may be used in at least one pre-texturing step in a multi-step method of texturing a wafer that may be a monocrystalline substrate (e.g., Si<100> or Si<111>), a microcrystalline silicon substrate, multi-crystalline silicon substrate, a strained silicon substrate, an amorphous silicon substrate, a doped or undoped polysilicon substrate, glass, sapphire or any type of silicon containing substrate. The substrate may also be a film of silicon deposited on a different type of substrate such as a metal, glass or polymer. The pre-texturing step that precedes the texturing step is a pretreatment step, that involves the use of the formulation of the present disclosure, comprising a surfactant or mixtures of more than one surfactant in a solution.

It is believed that the pre-texturing formulation comprising one or more surfactants improves (decreases) the reflectance of the wafers after or during the pre-texturing step(s) and texturing step(s). The pre-texturing step will use the pre-texturing formulation of the present disclosure comprising the surfactant, and the texturing step may be any standard texturing or etching step using any known etching composition or etching solution, also commonly referred to as a wet etchant. For example, the texturing step may use a standard texturing solution in a standard texturing bath.

The pre-texturing formulation of the present disclosure, when used in a pre-texturing step, may provide the added benefit of cleaning the silicon surface. After the texturing process is complete, the texturing quality is improved, with the formation of high density, small pyramids for the case of moncrystalline silicon and a more uniform textured surface for the case of multicrystalline silicon, leading to lower reflectance.

The present disclosure further provides methods of texturing a silicon wafer comprising the step of wetting said wafers with one or more pre-texturing formulations disclosed herein, and methods of texturing a silicon wafer comprising the step of wetting said wafer with a pre-texturing formulation described herein, methods of texturing silicon wafers comprising the steps of: wetting said wafer with a pre-texturing formulation as described herein; and wetting said wafer with an etching composition. Any of the above-described pre-texturing formulations may be used in the methods of the present disclosure.

The texturing process of the present disclosure may be a multi-step texturing process comprising at least a pre-texturing step followed by a texturing step. The multi-step texturing process may also comprise one or more rinse steps, one or more cleaning steps, one or more optional saw damage removal steps, and/or other steps. The wafer may be wetted with the pre-texturing formulation of the present disclosure before a saw damage removal step, before the texturing (etching) step, or before both the saw damage removal and texturing steps.

The wafers may be rinsed in separate rinsing steps before and after the pre-texturing and/or texturing steps. The wetting may be done at room temperature or elevated temperature. The wafer may be wetted with the pre-texturing formulation of the present disclosure for a time that may vary based on the method by which the pre-texturing formulation of the present disclosure is applied to the wafer.

II. Etchants

The present disclosure provides formulations of etchants. The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

In the production of advanced integrated circuits, to minimize problems associated with the higher density and to optimize performance, both high k and low k insulators, and assorted barrier layer materials have been employed.

Tantalum (Ta) and tantalum nitride (TaN) are utilized for semiconductor devices, liquid crystal displays, MEMS (Micro Electro Mechanical Systems), printed wiring boards and the like, and as ground layers and cap layers for precious metal, aluminum (Al) and copper (Cu) wiring. In semiconductor devices, it may be used as a barrier metal, a hard mask, or a gate material.

In the construction of devices for these applications, Ta and TaN frequently need to be etched. In the various types of uses and device environments of Ta and TaN, other layers are in contact with or otherwise exposed at the same time as these two materials are etched. Highly selective etching of the Ta and TaN in the presence of these other materials (e.g. metal conductors, dielectric, and hard marks) is required for device yield and long life.

The present disclosure includes formulations for etchants processes for selectively etching Ta and/or TaN relative to metal conductor layers, hard mask layers and low-k dielectric layers that are present in the semiconductor device. More specifically, the present disclosure relates to compositions and processes for selectively etching Ta and/or TaN relative to copper and low-k dielectric layers.

The etchant formulations of the present disclosure may have a relatively high Ta/Cu and/or TaN/Cu etch selectivity (i.e., a high ratio of Ta etch rate over Cu etch rate and/or a high ratio of TaN etch rate over Cu etch rate). In some embodiments, the etching composition can have a Ta/Cu and/or TaN/Cu etch selectivity of about 2 or greater, about 3 or greater, about 4 or greater, about 5 or greater, about 6 or greater, about 7 or greater, about 8 or greater, about 9 or greater, about 10 or greater, about 15 or greater, about 20 or greater, about 30 or greater, about 40 or greater, about 50 or greater, or about 60 or lower, about 70 or lower, about 80 or lower, about 90 or lower, about 100 or lower, or within any range using these endpoints.

The etchant formulations of the present disclosure may have a relatively high Ta/dielectric material (e.g., $SiO_2$ or low-k materials) and/or TaN/dielectric material etch selectivity (i.e., a high ratio of Ta etch rate over dielectric material etch rate and/or a high ratio of TaN etch rate over dielectric material etch rate). In some embodiments, the etching composition can have a Ta/dielectric material and/or TaN/dielectric material etch selectivity of about 2 or greater, about 3 or greater, about 4 or greater, about 5 or greater, about 6 or greater, about 7 or greater, about 8 or greater, about 9 or greater, about 10 or greater, about 15 or greater, about 20 or greater, about 30 or greater, about 40 or greater, about 50 or greater, or about 60 or lower, about 70 or lower, about 80 or lower, about 90 or lower, about 100 or lower, or within any range using these endpoints.

The etchant of the present disclosure may include hydrofluoric acid (HF), one or more surfactants chosen from one or more surfactant classes, one or more solvents, optionally one or more oxidizing agents, and one or more complexing agents.

1. Hydrofluoric Acid

It is believed that hydrofluoric acid can facilitate and enhance the removal of Ta and/or TaN on a semiconductor substrate during the etching process.

The hydrofluoric acid may be present in the etchant formulation in an amount of about 0.1 wt. % or greater, about 0.2 wt. % or greater, about 0.4 wt. % or greater, 0.5 wt. % or greater, about 0.6 wt. % or greater, about 0.8 wt. % or greater, about 1.0 wt. % or greater, about 1.2 wt. % or greater, about 1.4 wt. % or greater, about 1.5 wt. % or greater, or about 2.0 wt. % or lower, about 2.5 wt. % or lower, about 3 wt. % or lower, about 3.5 wt. % or lower, about 4.0 wt. % or lower, about 4.5 wt. % or lower, about 5.0 wt. % or lower, or within any range using these endpoints.

2. Surfactant

The etchant formulations of the present disclosure comprise one or more surfactants, also referred to as the surfactant system. The surfactant may facilitate homogeneity of the etching composition and help dissolve components (e.g., a sulfonic acid) in the solvent.

Suitable surfactants for use in the etchant formulations of the present disclosure include one or more surfactants and/or co-surfactants of Formula I,

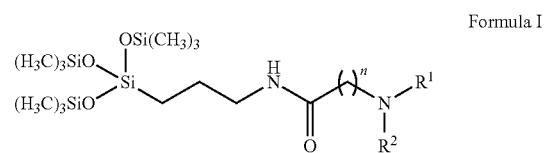

Formula I wherein $R^1$ and $R^2$ may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate; n is an integer from 1 to 12; the terminal nitrogen is optionally further substituted with $R^3$, wherein $R^3$ is selected from the group consisting of hydrogen, oxygen, hydroxyl, and $C_1$-$C_6$ alkyl; and an optional counterion associated with the compound which, if present, is selected from the group consisting of chloride, bromide, and iodide.

In particular, suitable surfactants or co-surfactants may include one or more of any of Surfactants 1-6 described herein.

The surfactant may be present in the etchant formulations in an amount of about 0.0001 wt. % or greater, about 0.01 wt. % or greater, about 0.1 wt. % or greater about 0.2 wt. % or greater, about 0.3 wt. % or greater, about 0.4 wt. % or greater, about 0.5 wt. % or greater, or about 0.6 wt. % or lower, about 0.7 wt. % or lower, about 0.8 wt. % or lower, about 0.9 wt. % or lower, about 1.0 wt. % or lower, or within any range using these endpoints.

3. Solvents

The etchant formulations of the present disclosure may include one or more solvents. The etching composition may include a first solvent that is a carboxylic acid. Carboxylic acids used as the first solvent may facilitate and enhance the removal of Ta and/or TaN on a semiconductor substrate during the etching process.

Suitable first solvents may include a carboxylic acid of the formula: R—COOH, in which R is H or $C_1$-$C_6$ alkyl, such as formic acid, acetic acid, trifluoroacetic acid, propionic acid, lactic acid, butyric acid, valeric acid, and caproic acid.

The first solvent may be the majority component of the etchant formulation of this disclosure. For example, the first solvent may be present in the etchant formulation in an amount of about 70 wt. % or greater, about 75 wt. % or greater, about 80 wt. % or greater, about 85 wt. % or greater, or about 90 wt. % or lower, about 95 wt. % or lower, about 96 wt. % or lower, about 97 wt. % or lower, about 98 wt. % or lower, about 99 wt. % or lower, about 99.9 wt. % or lower, or within any range using these endpoints.

Alternatively, the etchant formulation of the present disclosure can include two or more solvents. For example, the etching composition can include at least one second solvent selected from the group consisting of organic solvents (that are not carboxylic acids) and inorganic solvents. Suitable inorganic solvents include water and aqueous solutions. The water may be de-ionized and ultra-pure, contain no organic contaminants and have a minimum resistivity of about 4 to about 17 mega Ohms, or at least about 17 mega Ohms.

The at least one second solvent (e.g., water) may be present in an amount of about 0.01 wt. % or greater, about 0.1 wt. % or greater, about 0.5 wt. % or greater, about 1 wt. % or greater, about 2 wt. % or greater, about 4 wt. % or greater, about 5 wt. % or greater, or about 6 wt. % or lower, about 7 wt. % or lower, about 8 wt. % or lower, about 9 wt. % or lower, about 10 wt. % or lower, or within any range using these endpoints.

The second solvent can be an organic solvent that is not a carboxylic acid. For examples, the organic solvent can be a hydrophobic organic solvent having a partition coefficient (log P) of about 0 or greater, about 0.1 or greater, about 0.2 or greater, about 0.3 or greater, about 0.5 or greater, about 1.0 or greater, about 1.5 or greater, about 2.0 or greater, or about 2.5 or lower, about 3.0 or lower, about 3.5 or lower, about 4.0 or lower, about 4.5 or lower, about 5.0 or lower, or within any range using these endpoints.

As used herein, the partition coefficient log P is obtained from a biphasic system of n-octanol and water. In some embodiments, the organic solvent can be an alcohol or an ether. The ether can be an alkylene glycol ether (e.g., a dialkylene glycol ether, a trialkylene glycol ether, and a tetraalkylene glycol ether). Examples of such organic solvents include benzyl alcohol, diethylene glycol butyl ether, diethylene glycol dimethyl ether, diethylene glycol diethyl ether, diproylene glycol diethyl ether, tetraethylene glycol dimethyl ether, and dipropylene glycol dimethyl ether. Without wishing to be bound by theory, it is believed that using a hydrophobic organic solvent can inhibit the removal of the Cu without reducing the removal of Ta or TaN during the etching process.

The at least one second solvent (e.g., an organic solvent) may be present in an amount of about 0.1 wt. % or greater, about 0.2 wt. % or greater, about 0.4 wt. % or greater, about 0.5 wt. % or greater, about 0.6 wt. % or greater, about 0.8 wt. % or greater, about 1.0 wt. % or greater, about 1.5 wt. % or greater, about 2.0 wt. % or greater, about 2.5 wt. % or greater, about 5.0 wt. % or greater, or about 6.0 wt. % or lower, about 8.0 wt. % or lower, about 10 wt. % or lower, about 15 wt. % or lower, about 20 wt. % or lower, or within any range using these endpoints.

4. Oxidizing Agents

The etchant formulations of the present disclosure can optionally include any oxidizing agent suitable for use in microelectronic applications. The oxidizing agent may facilitate and enhance the removal of Ta and/or TaN on a semiconductor substrate. Suitable oxidizing agents include, but are not limited to, oxidizing acids or salts thereof (e.g., nitric acid, permanganic acid, or potassium permanganate), peroxides (e.g., hydrogen peroxide, dialkylperoxides, urea hydrogen peroxide), persulfonic acid (e.g., hexafluoropropanepersulfonic acid, methanepersulfonic acid, trifluoromethanepersulfonic acid, or p-toluenepersulfonic acid) and salts thereof, ozone, percarbonic acids (e.g., peracetic acid) and salts thereof, perphosphoric acid and salts thereof, persulfuric acid and salts thereof (e.g., ammonium persulfate or tetramethylammonium persulfate), perchloric acid and salts thereof (e.g., ammonium perchlorate, sodium perchlorate, or tetramethylammonium perchlorate)), and periodic acid and salts thereof (e.g., periodic acid, ammonium periodate, or tetramethylammonium periodate). These oxidizing agents can be used singly or in combination.

The oxidizing agent may be present in the etchant formulation in an amount of about 0.01 wt. % or greater, about 0.02 wt. % or greater, about 0.04 wt. % or greater, about 0.05 wt. % or greater, about 0.06 wt. % or greater, about 0.08 wt. % or greater, about 0.1 wt. % or greater, about 0.15 wt. % or greater, about 0.2 wt. % or greater, or about 0.25 wt. % or lower, about 0.3 wt. % or lower, about 0.35 wt. % or lower, about 0.4 wt. % or lower, about 0.45 wt. % or lower, about 0.5 wt. % or lower, or within any range using these endpoints.

Alternatively, the etchant formulations of the present disclosure can exclude an oxidizing agent (e.g., nitric acid). In such embodiments, the etching composition may still be able to selectively etching Ta and/or TaN relative to other materials (e.g., metal conductor layers, hard mask layers and low-k dielectric layers) in a patterned semiconductor substrate (e.g., a patterned wafer).

5. Complexing Agents

The etchant formulations of the present disclosure may include any suitable complexing agent. The complexing agent may facilitate and enhance the removal of Ta and/or TaN on a semiconductor substrate, while inhibiting the removal of Cu exposed to the etching composition during the etching process. Suitable complexing agents may be selected from the group consisting of polycarboxylic acids and hydroxycarboxylic acids. As used herein, the term "polycarboxylic acid" refers a compound containing two or more (e.g., two, three, or four) carboxyl groups (COOH). Examples of suitable polycarboxylic acids include oxalic acid, malonic acid, succinic acid, glutaric acid, and adipic acid. As used herein, the term "hydroxycarboxylic acid" refers to compounds containing at least one (e.g., two, three, or four) hydroxyl group (OH) and at least one (e.g., two, three, or four) carboxyl groups (COOH). Examples of suitable hydroxycarboxylic acids include citric acid and 2-hydroxybenzoic acid. In some embodiments, the polycarboxylic acid includes no hydroxyl group. In some embodiments, the hydroxycarboxylic acid includes only one hydroxyl group.

The complexing agent may be included in the etchant formulation in an amount of about 0.1 wt. % or greater, about 0.2 wt. % or greater, about 0.4 wt. % or greater, about 0.5 wt. % or greater, about 0.6 wt. % or greater, about 0.8 wt. % or greater, about 1.0 wt. % or greater, about 1.5 wt. % or greater, about 2.0 wt. % or greater, about 2.5 wt. % or greater, about 5.0 wt. % or greater, or about 6.0 wt. % or lower, about 6.5 wt. % or lower, about 7.0 wt. % or lower, about 7.5 wt. % or lower, about 8.0 wt. % or lower, about 8.5 wt. % or lower, about 9.0 wt. % or lower, about 9.5 wt. % or lower, about 10 wt. % or lower, or within any range using these endpoints.

6. Other Additives

The etchant formulations of the present disclosure may further include at least one hexafluorosilicate compound. The hexafluorosilicate compounds described below may facilitate and enhance the removal of Ta and/or TaN on a semiconductor substrate, while inhibiting the removal of a dielectric material ($SiO_2$) exposed to the etching composition during the etching process. Suitable hexafluorosilicate compounds include hexafluorosilicic acid ($H_2SiF_6$) and its salts thereof. Specific examples of hexafluorosilicate compounds include $H_2SiF_6$, $Na_2SiF_6$, $K_2SiF_6$, and $(NH_4)_2SiF_6$.

The hexafluorosilicate compound may be present in the etchant formulation in an amount of about 0.1 wt. % or greater, about 0.2 wt. % or greater, about 0.4 wt. % or greater, 0.5 wt. % or greater, about 0.6 wt. % or greater, about 0.8 wt. % or greater, about 1.0 wt. % or greater, about 1.2 wt. % or greater, about 1.4 wt. % or greater, about 1.5 wt. % or greater, or about 2.0 wt. % or lower, about 2.5 wt. % or lower, about 3 wt. % or lower, about 3.5 wt. % or lower, about 4.0 wt. % or lower, about 4.5 wt. % or lower, about 5.0 wt. % or lower, or within any range using these endpoints.

The etchant formulations of the present disclosure may further include at least one sulfonic acid. The sulfonic acids may facilitate and enhance the removal of Ta and/or TaN on a semiconductor substrate during the etching process. Examples of suitable sulfonic acids include p-toluene sulfonic acid, methanesulfonic acid, or dodecylbenzene sulfonic acid.

The sulfonic acid may be present in the etchant formulations in an amount of about 0.1 wt. % or greater, about 0.2 wt. % or greater, about 0.4 wt. % or greater, about 0.5 wt. % or greater, about 0.6 wt. % or greater, about 0.8 wt. % or greater, about 1.0 wt. % or greater, about 1.5 wt. % or greater, about 2.0 wt. % or greater, about 2.5 wt. % or greater, about 5.0 wt. % or greater, or about 6.0 wt. % or lower, about 6.5 wt. % or lower, about 7.0 wt. % or lower, about 7.5 wt. % or lower, about 8.0 wt. % or lower, about 8.5 wt. % or lower, about 9.0 wt. % or lower, about 9.5 wt. % or lower, about 10 wt. % or lower, or within any range using these endpoints.

In addition, the etchant formulations of the present disclosure may contain additional additives such as pH adjusting agents, corrosion inhibitors, additional surfactants, additional organic solvents, biocides, and defoaming agents as optional components.

7. Method of Making

The etching composition of this disclosure can be prepared by simply mixing the components together, or may be prepared by blending two compositions in a kit. The first composition in the kit can be an aqueous solution of an oxidizing agent (e.g., nitric acid). The second composition in the kit can contain the remaining components of the etching composition of this disclosure at predetermined ratios in a concentrated form such that the blending of the two compositions will yield a desired etching composition of the disclosure.

8. Method of Use

The present disclosure provides a method of etching a semiconductor substrate containing Ta and/or TaN (e.g., features containing Ta and/or TaN). The method includes contacting a semiconductor substrate containing Ta and/or TaN with an etching composition of this disclosure to remove Ta and/or TaN. The method can further include rinsing the semiconductor substrate with a rinse solvent after the contacting step and/or drying the semiconductor substrate after the rinsing step. In some embodiments, the method does not substantially remove Cu or a dielectric material (e.g., $SiO_2$) in the semiconductor substrate. For example, the method does not remove more than about 5% by weight (e.g., more than about 3% by weight or more than about 1% by weight) of Cu or a dielectric material in the semiconductor substrate.

The etching method may include the steps of: 1) providing a semiconductor substrate containing Ta and/or TaN; 2) contacting the semiconductor substrate with an etching composition described herein; 3) rinsing the semiconductor substrate with one or more suitable rinse solvents; and 4) optionally, drying the semiconductor substrate (e.g., by any suitable means that removes the rinse solvent and does not compromise the integrity of the semiconductor substrate).

The semiconductor substrates containing Ta and/or TaN to be etched in this method can contain organic and organometallic residues, and additionally, a range of metal oxides that may also be removed during the etching process. Semiconductor substrates (e.g., wafers) typically are constructed of silicon, silicon germanium, Group III-V compounds such as GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrates may also contain layers of interlayer dielectrics, silicon oxide, silicon nitride, silicon carbide, titanium oxide, and carbon doped silicon oxides.

A semiconductor substrate can be contacted with the etching composition by any suitable method, such as placing the etching composition into a tank and immersing and/or submerging the semiconductor substrate into the etching composition, spraying the etching composition onto the semiconductor substrate, streaming the etching composition onto the semiconductor substrate, or any combinations thereof.

III. Photoresist Stripper

The present disclosure further provides formulations of photoresist strippers. A semiconductor integrated circuit and a device circuit of a liquid crystal panel have very fine structures. The fine circuits are generally fabricated by uniformly coating a photoresist on an insulating film or a conductive metal film (such as an oxide film or an Al alloy film respectively), coated on a substrate, and exposing and developing the photoresist to form a certain pattern, and etching the metal film or insulating film by using the patterned photoresist as a mask, and thereafter, by removing the unnecessary photoresist.

A photoresist stripping formulation is used in removing the photoresist from a substrate. In general, the photoresist stripping formulation should have a high stripping force at both low and high temperatures, and should leave no residues on the substrate. Further, a desirable stripper should not corrode a metal film, while causing little hazard to both humans and the environment considering the large amount of stripping composition used in fabricating a large-scale liquid crystal display panel circuit.

The present disclosure provides a photoresist stripping formulation suitable for both the single wafer treatment method and the dipping method for stripping the photoresist, particularly a formulation that leaves no impurities on the substrate even when the single wafer treatment method using an air knife process is applied to strip off the photoresist.

The present disclosure further provides a photoresist stripping composition that has a good stripping force against various kinds of films coated on the substrate, and prevents the formation of impurity particles when cleaning the bare glass.

In order to be suitable for both of the single wafer treatment photoresist stripping process using high air pressure (air knife) and the dipping process, it is essential that the photoresist stripping formulation has a good stripping force and is non-corrosive and forms no impurity particles on the substrate.

To effectively prevent any of impurities on the substrate, the stripping formulation should be easily absorbed by various LCD layers, such as an indium tin oxide (ITO) film, an aluminum, chrome, silicon nitride film and an amorphous silicon film. Also, the stripping formulation should show a uniformly low surface tension with the LCD layers. Further, it should have a low volatility and viscosity. In addition, the contact angle between the surface of LCD layers and the stripping formulation as dropped onto the surface should be small and maintained constant.

In addition, it is desirable that the stripping formulation shows uniform physical characteristics against various kinds of LCD layers and that the stripping formulation be able to prevent the formation of impurity particles on a bare glass when testing the existence of particles within the LCD manufacturing facilities.

The photoresist stripping formulation of the present disclosure includes an alkanolamine, a sulfoxide or sulfone compound, a glycol ether, and one or more surfactants chosen from one or more surfactant classes.

1. Alkanolamine

The alkanolamine strips the photoresist from the substrate. Suitable alkanolamines include monoisopropanolamine and monoethanolamine.

The alkanolamine is present in the photoresist stripper formulation in an amount of about 5 wt. % or greater, about 6 wt. % or greater, about 7 wt. % or greater, about 8 wt. % or greater, about 9 wt. % or greater, or about 10 wt. % or lower, about 11 wt. % or lower, about 12 wt. % or lower, about 13 wt. % or lower, about 14 wt. % or lower, about 15 wt. % or lower, or within any range using these endpoints.

2. Sulfoxide or Sulfone

The sulfoxide or sulfone compound is provided as a solvent dissolving the photoresist, and it controls the surface tension between the stripping composition and the LCD layers. Suitable compounds include diethylsulfoxide, dimethylsulfoxide, diethylsulfone, or dimethylsulfone.

The sulfoxide or sulfone compound may be included in the photoresist stripping formulation in an amount of about 35 wt. % or greater, about 40 wt. % or greater, or about 45 wt. % or lower, about 50 wt. % or lower, about 55 wt. % or lower, or within any range using these endpoints.

3. Glycol Ether

The glycol ether serves, in combination with the aforementioned sulfoxide or sulfone compound, to dissolve the photoresist and control the surface tension between the compound and the LCD layers to enhance the air-knife photoresist stripping capabilities much more than the composition consisting of dimethylsulfoxide and monoethanolamine. Even though dimethylsulfoxide by itself serves to enhance the air knife photoresist stripping capabilities, its combination with monoethanolamine greatly reduces the air knife photoresist stripping capabilities. However, the addition of glycol ether in the compound consisting of dimethylsulfoxide and monoethanolamine increases both the air-knife photoresist stripping capabilities and the photoresist stripping force of the compound.

Suitable glycol ether compounds include ethyldiglycol, methyldiglycol or butyidiglycol.

The glycol ether is may be included in the photoresist stripping formulation in an amount of about 35 wt. % or greater, about 40 wt. % or greater, or about 45 wt. % or lower, about 50 wt. % or lower, about 55 wt. % or lower, or within any range using these endpoints.

4. Surfactant

One or more surfactants may be included in the photoresist stripper formulations. Surfactants may prevent the creation and residues of impurity particles on the substrate while rinsing the bare glass Suitable surfactants for use in the photoresist stripper formulations of the present disclosure include one or more surfactants and/or co-surfactants of Formula I,

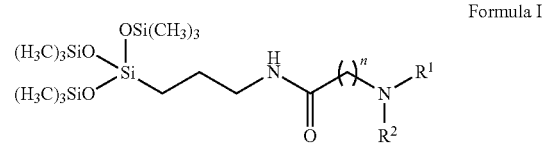

Formula I wherein $R^1$ and $R^2$ may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate; n is an integer from 1 to 12; the terminal nitrogen is optionally further substituted with $R^3$, wherein $R^3$ is selected from the group consisting of hydrogen, oxygen, hydroxyl, and $C_1$-$C_6$ alkyl; and an optional counterion associated with the compound which, if present, is selected from the group consisting of chloride, bromide, and iodide.

In particular, suitable surfactants or co-surfactants may include one or more of any of Surfactants 1-6 described herein.

The photoresist stripper formulations may include one or more surfactants in an amount of about 0.05 wt. % or greater, about 0.1 wt. % or greater, about 0.2 wt. % or greater, or about 0.3 wt. % or lower, about 0.4 wt. % or lower, about 0.5 wt. % of lower, or within any range using these endpoints.

5. Other Additives

The photoresist stripper formulations of the present disclosure may further include tetramethyl ammonium hydroxide in an amount of 1 wt. % or greater, about 2 wt. % or greater, about 3 wt. % or greater, about 4 wt. % or greater, about 5 wt. % or greater, or about 6 wt. % or lower, about 7 wt. % or lower, about 8 wt. % or lower, about 9 wt. % or lower, about 10 wt. % or lower, or within any range using these endpoints.

The photoresist stripper formulation may also include benzenediol in an amount of about 3 wt. % or greater, about 4 wt. % or greater, about 5 wt. % or greater, about 6 wt. % or greater, about 7 wt. % or greater, about 8 wt. % or greater, about 9 wt. % or greater, or about 10 wt. % or lower, about 11 wt. % or lower, about 12 wt. % or lower, about 13 wt. % or lower, about 14 wt. % or lower, about 15 wt. % or lower, or within any range using these endpoints.

The photoresist stripping formulation may also include an alkylsulfonic acid in an amount of about 1 wt. % or greater, about 2 wt. % or greater, about 3 wt. % or greater, about 4 wt. % or greater, about 5 wt. % or greater, about 6 wt. % or greater, about 7 wt. % or greater, about 8 wt. % or greater, about 9 wt. % or greater, or about 10 wt. % or lower, about 11 wt. % or lower, about 12 wt. % or lower, about 13 wt. % or lower, about 14 wt. % or lower, about 15 wt. % or lower, or within any range using these endpoints.

VI. Surfactants

The present disclosure provides surfactants for use in pre-texturing agents, etchants, and photoresist strippers in the form of siloxane derivatives of amino acids. The amino acids may be naturally occurring or synthetic, or they may be obtained from ring-opening reactions of lactams, such as caprolactam. The compounds of the present disclosure have been shown to have surface-active properties, and may be used as surfactants and wetting agents, for example. In particular, the present disclosure provides compounds of Formula I, shown below:

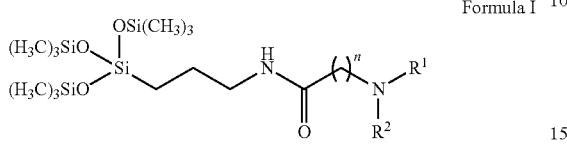

Formula I wherein $R^1$ and $R^2$ may be the same or different, and are at least one group selected from the group consisting of $C_1$-$C_6$ alkyl, optionally the $C_1$-$C_6$ alkyl may include one or more of oxygen, nitrogen, or sulfur atoms or substituents that include one or more of these atoms, the alkyl chain may be optionally substituted with one or more substituents selected from the group consisting of hydroxyl, amino, amido, sulfonyl, sulfonate, carbonyl, carboxyl, and carboxylate;

n is an integer from 1 to 12;

the terminal nitrogen is optionally further substituted with $R^3$, wherein $R^3$ is selected from the group consisting of hydrogen, oxygen, hydroxyl, and $C_1$-$C_6$ alkyl; and an optional counterion may be associated with the compound and, if present, the counterion may be selected from the group consisting of chloride, bromide, and iodide.

The present disclosure further provides for compounds of Formula Ia:

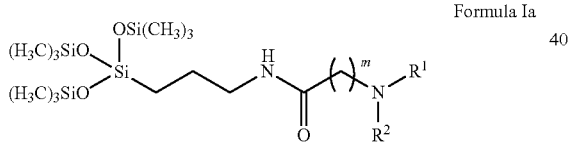

Formula Ia wherein $R^1$ and $R^2$ may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate;

m is an integer from 1 to 6;

the terminal nitrogen is optionally further substituted with $R^3$, wherein $R^3$ is selected from the group consisting of hydrogen, oxygen, and $C_1$-$C_6$ alkyl wherein the alkyl chain is optionally substituted with one or more substituents selected from the group consisting of carboxyl, carboxylate, and sulfonate; and an optional counterion may be associated with the compound and, if present, the counterion may be selected from the group consisting of chloride, bromide, and iodide.

The present disclosure additionally provides for compounds of Formula Ib:

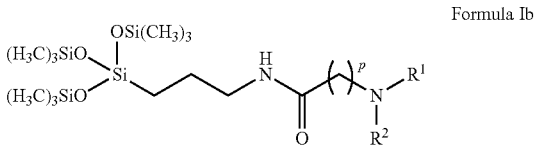

Formula Ib wherein $R^1$ and $R^2$ may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate;

p is 5;

the terminal nitrogen is optionally further substituted with $R^3$, wherein $R^3$ is selected from the group consisting of hydrogen, oxygen, and $C_1$-$C_6$ alkyl, wherein the alkyl chain is optionally substituted with one or more substituents selected from the group consisting of carboxyl, carboxylate, and sulfonate; and an optional counterion may be associated with the compound and, if present, the counterion may be selected from the group consisting of chloride, bromide, and iodide.

One specific compound provided by the present disclosure is 6-(dimethylamino)-N-(3-(1,1,1,5,5,5-hexamethyl-3-((trimethylsilyl)oxy)trisiloxan-3-yl)propyl)hexanamide (Surfactant 1), having the following formula:

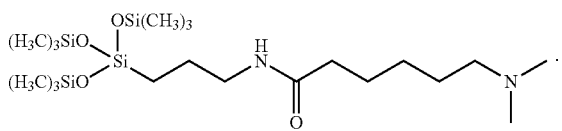

A second specific compound provided by the present disclosure is 6-(dimethylamino)-N-(3-(1,1,1,5,5,5-hexamethyl-3-((trimethylsilyl)oxy)trisiloxan-3-yl)propyl)hexaminium chloride (Surfactant 2), having the following formula:

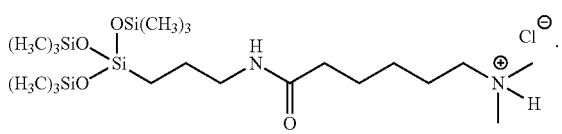

A third specific compound provided by the present disclosure is 3 6-((3-(1,1,1,5,5,5-hexamethyl-3-((trimethylsilyl)oxy)trisiloxan-3-yl)propyl)amino)-N,N,N-trimethyl-6-oxohexan-1-aminium iodide (Surfactant 3), having the following formula:

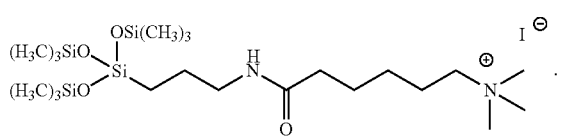

A fourth specific compound provided by the present disclosure is 6-((3-(1,1,1,5,5,5-hexamethyl-3-((trimethylsilyl)oxy)trisiloxan-3-yl)propyl)amino)-N, N-dimethyl-6-oxohexan-1-amine oxide (Surfactant 4), having the following formula:

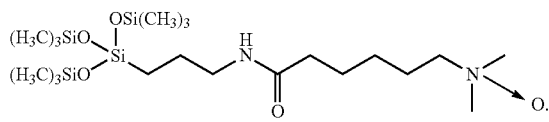

In the structure above, the notation "N→O" is intended to convey a non-ionic bonding interaction between nitrogen and oxygen.

A fifth specific compound provided by the present disclosure is 4-((6-((3-(1,1,1,5,5,5-hexamethyl-3-((trimethylsilyl)oxy)trisiloxan-3-yl)propyl)amino)-6-oxohexyl)dimethylammonio)butane-1-sulfonate (Surfactant 5), having the following formula:

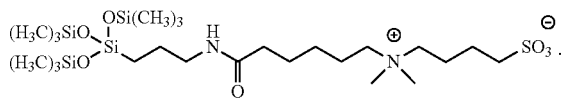

A sixth specific compound provided by the present disclosure is 5-((6-((3-(1,1,1,5,5,5-hexamethyl-3-((trimethylsilypoxy)trisiloxan-3-yl)propyl)amino)-6-oxohexyl)dimethylammonio)pentane-1-sulfonate (Surfactant 6), having the following formula:

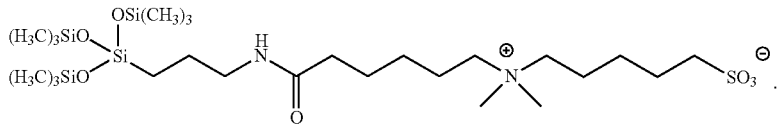

These compounds may be synthesized by various methods. One such method includes reacting an amino acid, such as an N-alkylated or N-acylated amino acid, with a siloxane to convert the amino acid C-terminus to the desired siloxane derivative. The amino acid N-terminus may be further protonated, alkylated, or oxidized to yield a quaternary amine or an N-oxide, for example.

The amino acid may be naturally occurring or synthetic or may be derived from a ring opening reaction of a lactam, such as caprolactam. The ring-opening reaction may be either an acid or alkali catalyzed reaction, and an example of an acid catalyzed reaction is shown below in Scheme 1.

SCHEME 1

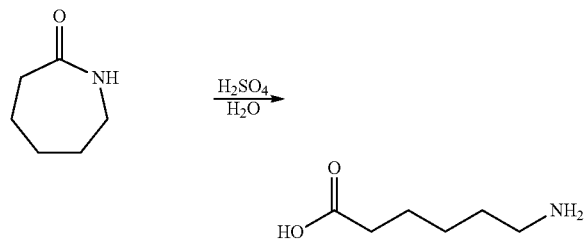

The amino acid may have as few as 1 or as many as 12 carbons between the N- and C-terminii. The alkyl chain may be branched or straight. The alkyl chain may be interrupted with nitrogen, oxygen, or sulfur. The alkyl chain may be further substituted with one or more substituents selected from the group consisting of hydroxyl, amino, amido, sulfonyl, sulfonate, carboxyl, and carboxylate. The N-terminal nitrogen may be acylated or alkylated with one or more alkyl groups. For example, the amino acid may be 6-(dimethylamino)hexanoic acid.

The siloxane may be substituted with one or more alkoxy groups, such as methoxy, ethoxy, isopropoxy, tertiary butoxy, and others. The siloxane may be further substituted with one or more alkyl groups, such as propyl, wherein the alkyl group may yet be further substituted with an appropriate functional group to permit coupling of the siloxane to the amino acid, such as a nitrogen. For example, the siloxane may be 3-aminopropyltris(trimethylsiloxy)silane.

The siloxane derivative of the amino acid may be synthesized as shown below in Scheme 2. As shown, 6-aminohexanoic acid is treated with formaldehyde in formic acid at reflux to give 6-(dimethylamino)hexanoic acid. The free carboxylic acid is then coupled to 3-aminopropyl(trismethylsiloxy)silane in refluxing toluene to give the desired siloxane derivative.

SCHEME 2

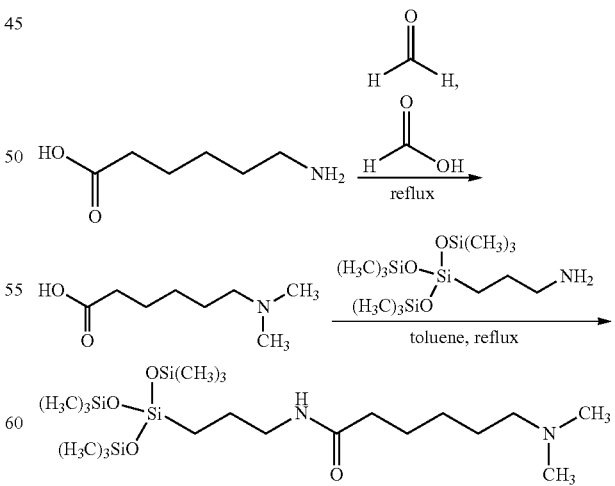

The N-terminal nitrogen may be further derivatized to modify or improve water solubility and surface-active properties. A sample synthetic scheme is shown below in Scheme 3, in which the N-terminal nitrogen is treated with hydrochloric acid to give the corresponding hydrochloride salt.

SCHEME 3

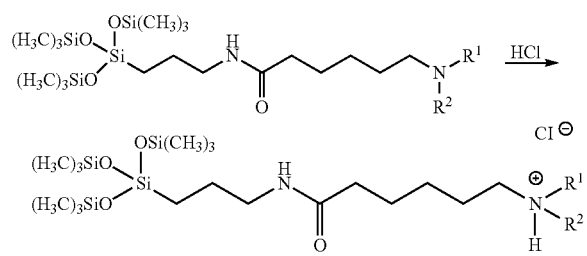

The N-terminal nitrogen may be alkylated. A sample synthetic scheme is shown below, in which the N-terminal nitrogen is treated with methyl iodide to give the corresponding quaternary amine salt.

SCHEME 4

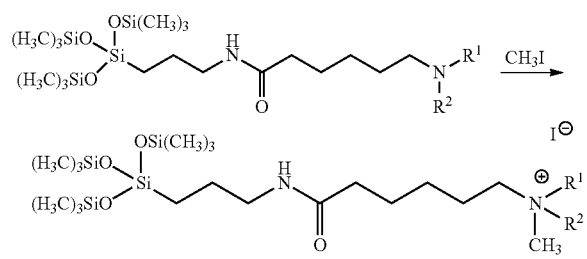

The N-terminal nitrogen may be treated with hydrogen peroxide in water at reflux to give the corresponding N-oxide, as shown in the sample synthetic scheme below, Scheme 5.

SCHEME 5

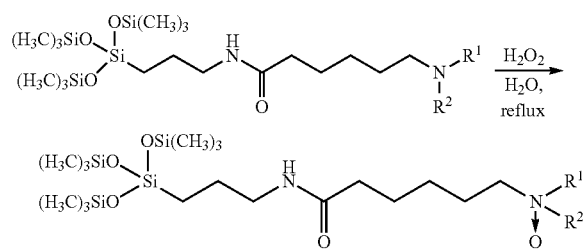

The compounds of the present disclosure demonstrate surface-active properties. These properties may be measured and described by various methods. One method by which surfactants may be described is by the molecule's critical micelle concentration (CMC). CMC may be defined as the concentration of a surfactant at which micelles form, and above which all additional surfactant is incorporated into micelles.

As surfactant concentration increases, surface tension decreases. Once the surface is completely overlaid with surfactant molecules, micelles begin to form. This point represents the CMC, as well as the minimum surface tension. Further addition of surfactant will not further affect the surface tension. CMC may therefore be measured by observing the change in surface tension as a function of surfactant concentration. One such method for measuring this value is the Wilhemy plate method. A Wilhemy plate is usually a thin iridium-platinum plate attached to a balance by a wire and placed perpendicularly to the air-liquid interface. The balance is used to measure the force exerted on the plate by wetting. This value is then used to calculate the surface tension (γ) according to Equation 1:

$$\gamma = F/l \cos \theta \qquad \text{Equation 1:}$$

wherein I is equal to the wetted perimeter (2w+2d, in which w and d are the plate thickness and width, respectively) and cos θ, the contact angle between the liquid and the plate, is assumed to be 0 in the absence of an extant literature value.

Another parameter used to assess the performance of surfactants is dynamic surface tension. The dynamic surface tension is the value of the surface tension for a particular surface or interface age. In the case of liquids with added surfactants, this can differ from the equilibrium value. Immediately after a surface is produced, the surface tension is equal to that of the pure liquid. As described above, surfactants reduce surface tension; therefore, the surface tension drops until an equilibrium value is reached. The time required for equilibrium to be reached depends on the diffusion rate and the adsorption rate of the surfactant.

One method by which dynamic surface tension is measured relies upon a bubble pressure tensiometer. This device measures the maximum internal pressure of a gas bubble that is formed in a liquid by means of a capillary. The measured value corresponds to the surface tension at a certain surface age, the time from the start of the bubble formation to the occurrence of the pressure maximum. The dependence of surface tension on surface age can be measured by varying the speed at which bubbles are produced.

Surface-active compounds may also be assessed by their wetting ability on solid substrates as measured by the contact angle. When a liquid droplet comes in contact with a solid surface in a third medium, such as air, a three-phase line forms among the liquid, the gas and the solid. The angle between the surface tension unit vector, acting at the three-phase line and tangent at the liquid droplet, and the surface is described as the contact angle. The contact angle (also known as wetting angle) is a measure of the wettability of a solid by a liquid. In the case of complete wetting, the liquid is completely spread over the solid and the contact angle is 0°. Wetting properties are typically measured for a given compound at the concentration of 1-100×CMC, however, it is not a property that is concentration-dependent therefore measurements of wetting properties can be measured at concentrations that are higher or lower.

In one method, an optical contact angle goniometer may be used to measure the contact angle. This device uses a digital camera and software to extract the contact angle by analyze the contour shape of a sessile droplet of liquid on a surface.

Potential applications for the surface-active compounds of the present disclosure include formulations for use as shampoos, hair conditioners, detergents, spot-free rinsing solutions, floor and carpet cleaners, cleaning agents for graffiti removal, wetting agents for crop protection, adjuvants for crop protection, and wetting agents for aerosol spray coatings.

It will be understood by one skilled in the art that small differences between compounds may lead to substantially different surfactant properties, such that different compounds may be used with different substrates, in different applications.

The following non-limiting embodiments are provided to demonstrate the different properties of the different surfactants. In Table 1 below, short names for the surfactants are correlated with their corresponding chemical structures.

TABLE 1

| Surfactant | Formula & Name |
|---|---|
| Surfactant 1 | 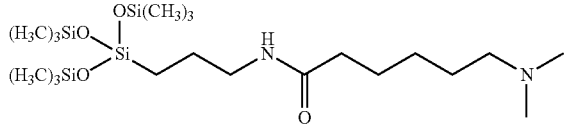<br>6-(dimethylamino)-N-(3-(1,1,1,5,5,5-hexamethyl-3-((trimethylsilyl)oxy)trisiloxan-3-yl)propyl)hexanamide |
| Surfactant 2 | 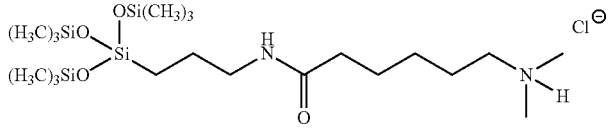<br>6-((3-(1,1,1,5,5,5-hexamethyl-3-((trimethylsilyl)oxy)trisiloxan-3-yl)propyl)amino)-N,N-dimethyl-6-oxohexan-1-aminium chloride |
| Surfactant 3 | 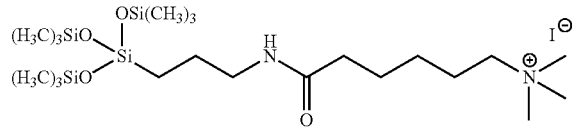<br>6-((3-(1,1,1,5,5,5-hexamethyl-3-((trimethylsilyl)oxy)trisiloxan-3-yl)propyl)amino)-N,N,N-trimethyl-6-oxohexan-1-aminium iodide |
| Surfactant 4 | 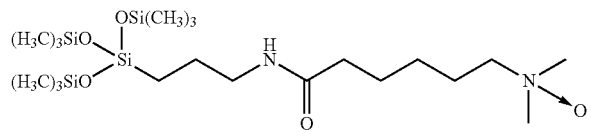<br>6-((3-(1,1,1,5,5,5-hexamethyl-3-((trimethylsilyl)oxy)trisiloxan-3-yl)propyl)amino)-N,N-dimethyl-6-oxohexan-1-amine oxide |
| Surfactant 5 | 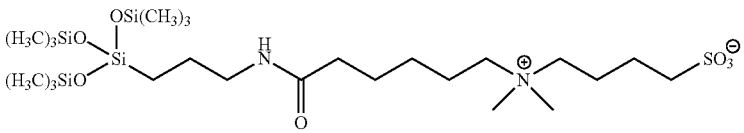<br>4-((6-((3-(1,1,1,5,5,5-hexamethyl-3-((trimethylsilyl)oxy)trisiloxan-3-yl)propyl)amino)-6-oxohexyl)dimethylammonio)butane-1-sulfonate |

Each of the five compounds are effective as surface-active agents, useful for wetting or foaming agents, dispersants, emulsifiers, and detergents, among other applications.

Surfactants 1 and 2 candidates for use in a variety of surface cleaning and personal care product formulations as foaming or wetting agents.

Surfactant 3 is cationic. These surfactants are useful in both the applications described above and some further special applications such as surface treatments, such as in personal hair care products, and can also be used to generate water repellant surfaces.

Surfactant 4 is non-ionic, and can be used in shampoos, detergents, hard surface cleaners, and a variety of other surface cleaning formulations.

Surfactant 5 is zwitterionic. These surfactants are useful as co-surfactants in all of the applications described above.

The amount of the compounds disclosed herein used in a formulation may be as low as about 0.001 wt. %, about 0.05 wt. %, about 0.1 wt. %, about 0.5 wt. %, about 1 wt. %, about 2 wt. %, or about 5 wt. %, or as high as about 8 wt. %, about 10 wt. %, about 15 wt. %, about 20 wt. %, or about 25 wt. %, or within any range using any two of the foregoing values.

EXAMPLES

Nuclear magnetic resonance (NMR) spectroscopy was performed on a Bruker 500 MHz spectrometer. The critical micelle concentration (CMC) was determined by the Wilhelmy plate method at 23° C. with a tensiometer (DCAT 11, DataPhysics Instruments GmbH) equipped with a Pt—Ir plate. Dynamic surface tension was determined with a bubble pressure tensiometer (Krüss BP100, Krüss GmbH), at 23° C. Contact angle was determined with the optical contact angle goniometer (OCA 15 Pro, DataPhysics GmbH) equipped with a digital camera.

Example 1a

Synthesis of 6-(dimethylamino)-N-(3-(1,1,1,5,5,5-hexamethyl-3-((trimethylsilyl)oxy)trisiloxan-3-yl)propyl)hexanamide (Surfactant 1) and 6-((3-(1,1,1,5,5,5-hexamethyl-3-((trimethylsilyl)oxy)trisiloxan-3-yl)propyl)amino)-N,N-dimethyl-6-oxohexan-1-aminium Salt (Surfactant 2)

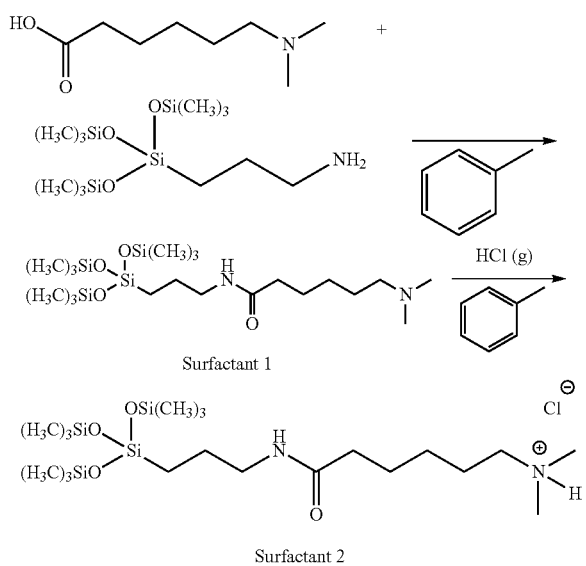

Surfactant 1

Surfactant 2

6-(Dimethylamino)hexanoic acid (2.00 g, 12.56 mmol, 1 equiv.) was dissolved in toluene (50 mL) in a 100 mL round bottom boiling flask equipped with a Dean Stark trap, then 3-aminopropyltris(trimethylsiloxy)silane (5.48 mL, 13.81 mmol, 1.1 equiv.) was added. The reaction vessel was heated, and the reaction refluxed for 24 hours until no more water separated in the Dean Stark tube. The solvent was removed under vacuum to give Surfactant 1 as a yellow oil in 94% yield. $^1$H NMR (500 MHz, DMSO) δ: 0.09 (s, 27H), 0.28-0.31 (m, 2H), 1.12-1.26 (m, 2H), 1.27-1.30 (m, 4H), 1.38-1.41 (m, 2H), 1.94 (t, J=7.3 Hz, 2H), 2.00 (s, 6H), 2.06-2.03 (m, 2H), 2.89 (dd, J=12.9, 6.8 Hz, 2H).

In its neutral form, Surfactant 1 is slightly soluble in pure water without addition of hydrotropes or other surfactants, but after protonation in slightly acidic conditions it becomes interfacially active (Surfactant 2). The acidic conditions can be generated by the addition of any acid or acidic buffer in the pH range of 4-7. Surfactant 2 can also be prepared in non-aqueous solutions, for example by sparging gaseous HCl in toluene in the presence of Surfactant 1.

Example 1 b

Determination of Critical Micelle Concentration (CMC) of Surfactant 2

The critical micelle concentration (CMC) for Surfactant 2 was tested with a chloride counterion and was determined to be about 2 mmol. The plateau value of minimum surface tension that can be reached by this surfactant is about 23 mN/m. FIG. 1 is a plot of these results, showing surface tension versus concentration.

Example 2a

Synthesis of 6-((3-(1,1,1,5,5,5-hexamethyl-3-((trimethylsilyl)oxy)trisiloxan-3-yl)propyl)amino)-N,N,N-trimethyl-6-oxohexan-1-aminium Iodide (Surfactant 3)

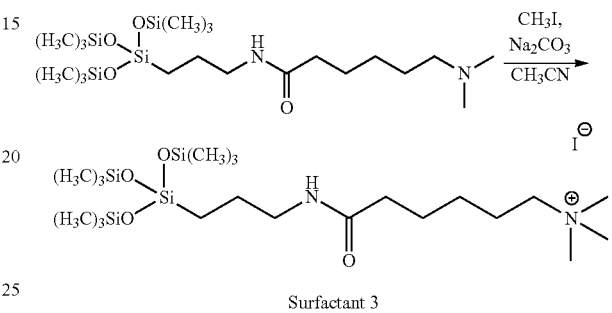

Surfactant 3

Surfactant 1 (1.00 g, 2.02 mmol, 1 equiv.) was dissolved in acetonitrile (10 mL) in a 100 mL round bottom flask. Next, Na$_2$CO$_3$ (0.26 g, 2.42 mmol, 1.2 equiv.) was added and the mixture was stirred for 10 minutes. Methyl iodide (0.377 mL, 6.06 mmol, 3 equiv.) was added and the reaction was heated at 40° C. for 24 hours. The cooled reaction mixture was filtered, and the solvent was removed under vacuum to give Surfactant 3 as a slightly yellow solid in quantitative yield. $^1$H NMR (500 MHz, DMSO) δ 0.09 (s, 27H), 0.38-0.42 (m, 2H), 1.23-1.26 (m, 2H), 1.37-1.40 (m, 2H), 1.52-1.55 (m, 2H), 1.65-1.69 (m, 2H), 2.08 (t, J=7.4 Hz, 2H), 2.99 (dd, J=13, 6.9 Hz, 2H), 3.04 (s, 9H),), 3.24-3.33 (m, 2H).

The pure product is soluble in water and has surfactant properties. The halogen anions may be directly obtained from the N-alkylation reaction, and other desired counter anions may be obtained by anion exchange.

Example 2b

Determination of Physical Properties of Surfactant 3

Figure 2:
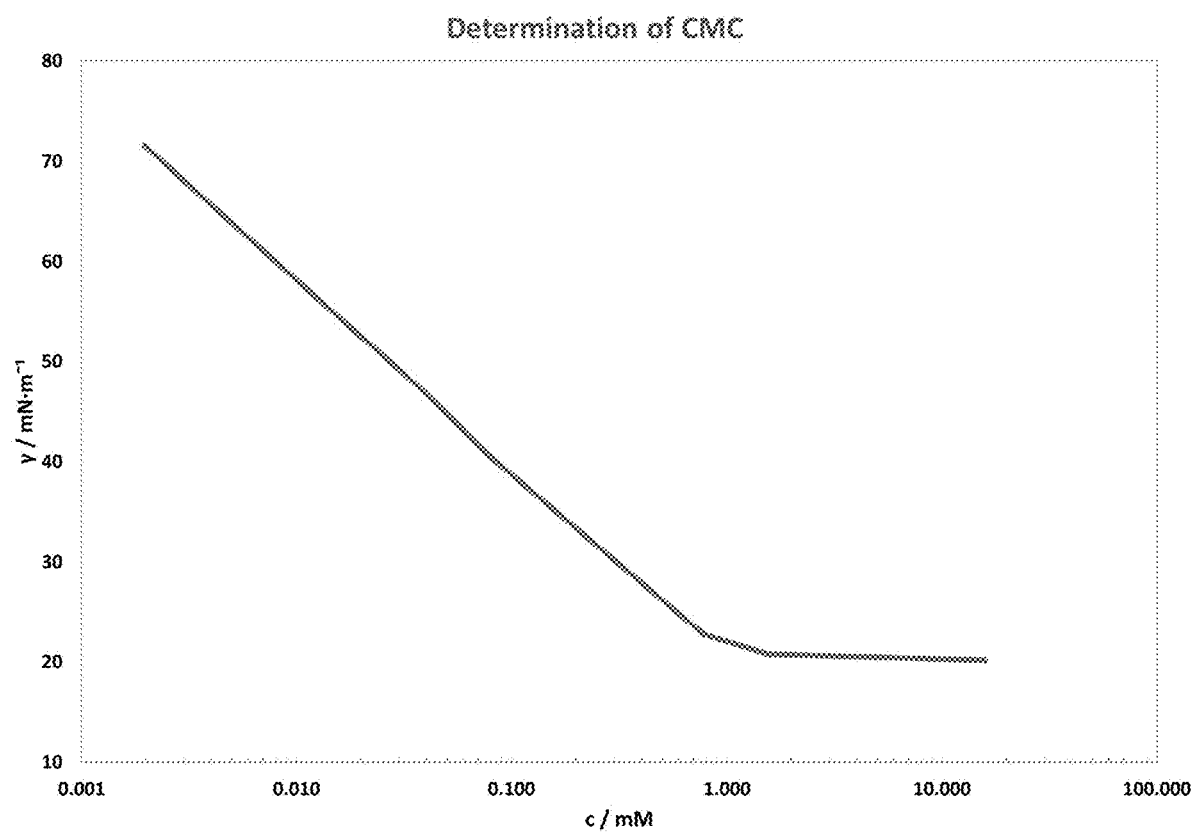
FIG. 2 shows a plot of surface tension versus concentration for Surfactant 3 as described in Example 2b.

The critical micelle concentration (CMC) for Surfactant 3 was measured. From the surface tension change with concentration in water, the CMC was determined to be about 1.6 mmol. The plateau value of minimum surface tension that can be reached by this surfactant is around 20 mN/m, indicating that the surfactant has outstanding interfacial activity. These results are plotted as surface tension versus concentration in FIG. 2.

Figure 3:
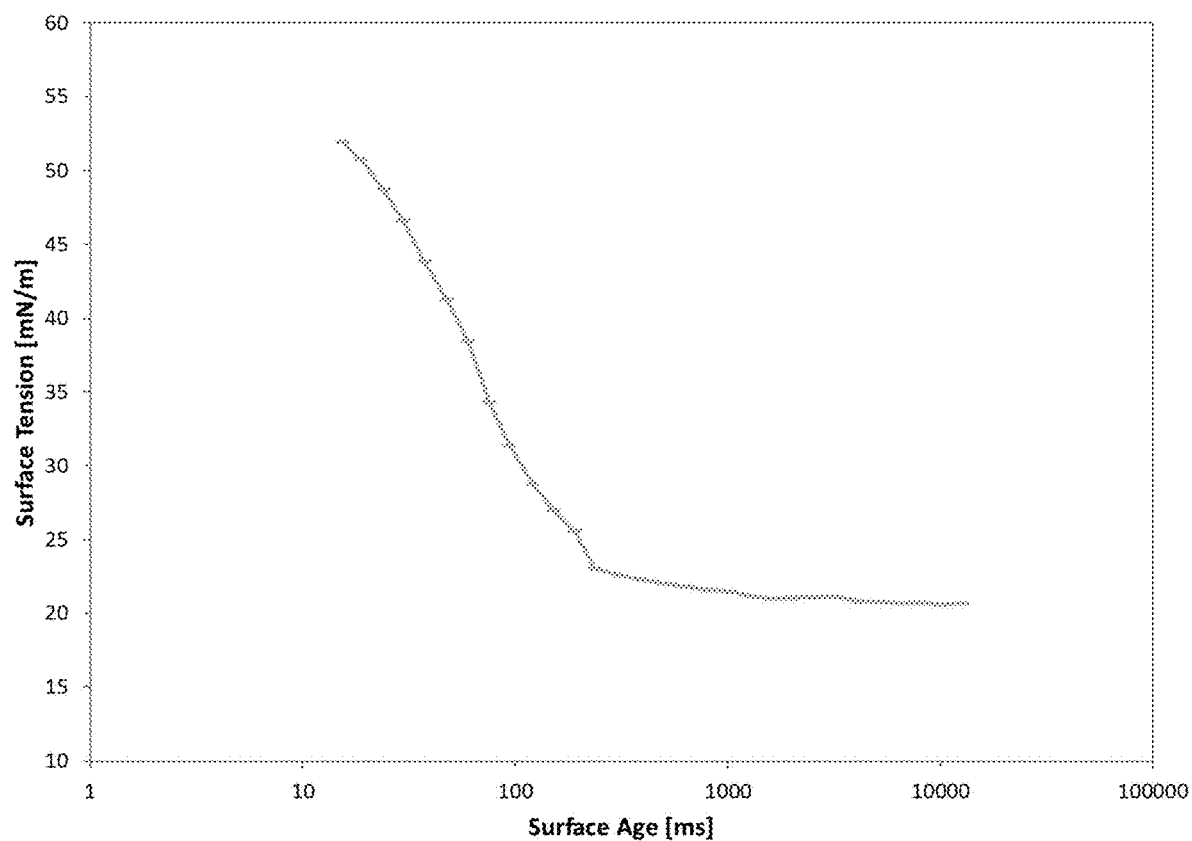
FIG. 3 shows a plot of dynamic surface tension as change in surface tension versus time for Surfactant 3 as described in Example 2b.

The dynamic surface tension of Surfactant 3 was determined with a bubble pressure tensiometer which measures the change of surface tension of a freshly created air-water interface with time. FIG. 3 shows a plot of the results as surface tension versus time and demonstrates that Surfactant 3 fully saturated the interface in less than 500 ms, making it exceptionally fast in terms of interfacial adsorption.

In addition to Surfactant 3's ability to lower both interfacial and surface tension, formulations containing only Surfactant have exceptional wetting properties. For example, hydrophobic substrates such as polyethylene and polypropylene exhibit a total surface wetting with a contact angle of 0°. On oleophobic and hydrophobic substrates such as Teflon, the measured contact angle was extremely low, 10.5° (Table 2).

TABLE 2

| Substrate | CA of Surfactant 3 (°) | Concentration | CA of water (°) |
|---|---|---|---|
| Teflon | 10.5 | 10x CMC | 119 |
| Polyethylene | 0 | 10x CMC | 91.5 |
| Polypropylene | 0 | 10x CMC | 93.3 |
| Nylon | 0 | 10x CMC | 50 |
| Polyethylene terephthalate | 0 | 10x CMC | 65.3 |

Example 3a

Synthesis of 6-((3-(1,1,1,5,5,5-hexamethyl-3-((trimethylsilyl)oxy)trisiloxan-3-yl)propyl)amino)-N,N-dimethyl-6-oxohexan-1-amine Oxide (Surfactant 4)

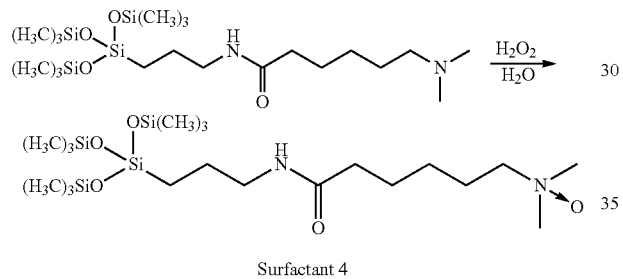

Surfactant 4

Surfactant 1 (1.00 g, 2.02 mmol, 1 equiv.) was added to distilled water (80 mL) in a 100 mL round bottom flask, followed by 50% hydrogen peroxide (1.15 mL, 20.2 mmol, 10 equiv.). The reaction was refluxed for 12 hours, then concentrated under vacuum. The residue was washed three times with acetone to give Surfactant 4 in 99% yield. $^1$H NMR (500 MHz, DMSO) δ 0.09 (s, 27H), 0.38-0.44 (m, 2H), 1.21-1.25 (m, 2H), 1.35-1.42 (m, 2H), 1.50-1.55 (m, 2H), 1.71-1.75 (m, 2H), 2.05-2.08 (m, 2H), 2.97-3.00 (m, 2H), 3.01 (s, 9H), 3.11-3.14 (m, 2H).

Example 3b

Determination of Physical Properties of Surfactant 4

Figure 4:
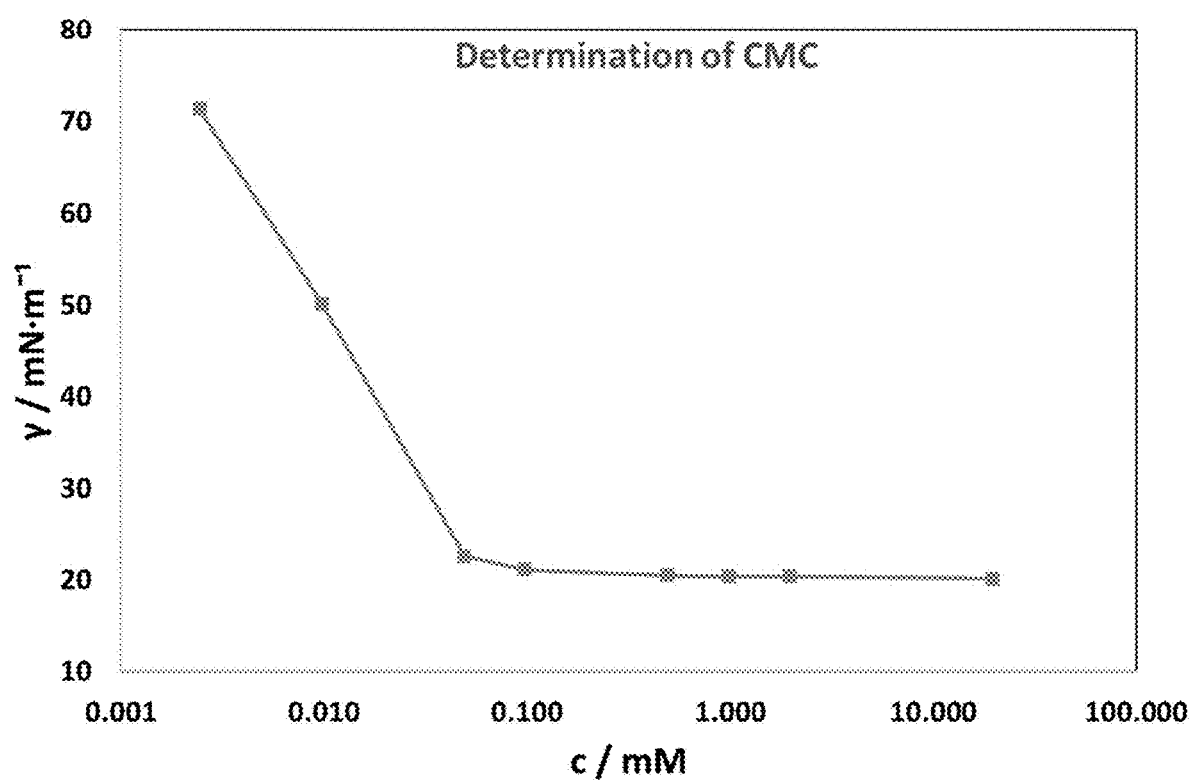
FIG. 4 shows a plot of surface tension versus concentration for Surfactant 4 as described in Example 3b.

The critical micelle concentration (CMC) for Surfactant 4 was measured. From the surface tension change with concentration in water, the CMC was determined to be about 0.49 mmol. The plateau value of minimum surface tension that can be reached by this surfactant is about 20 mN/m, indicating that the surfactant has outstanding interfacial activity. These results are plotted as surface tension versus concentration in FIG. 4.

Figure 5:
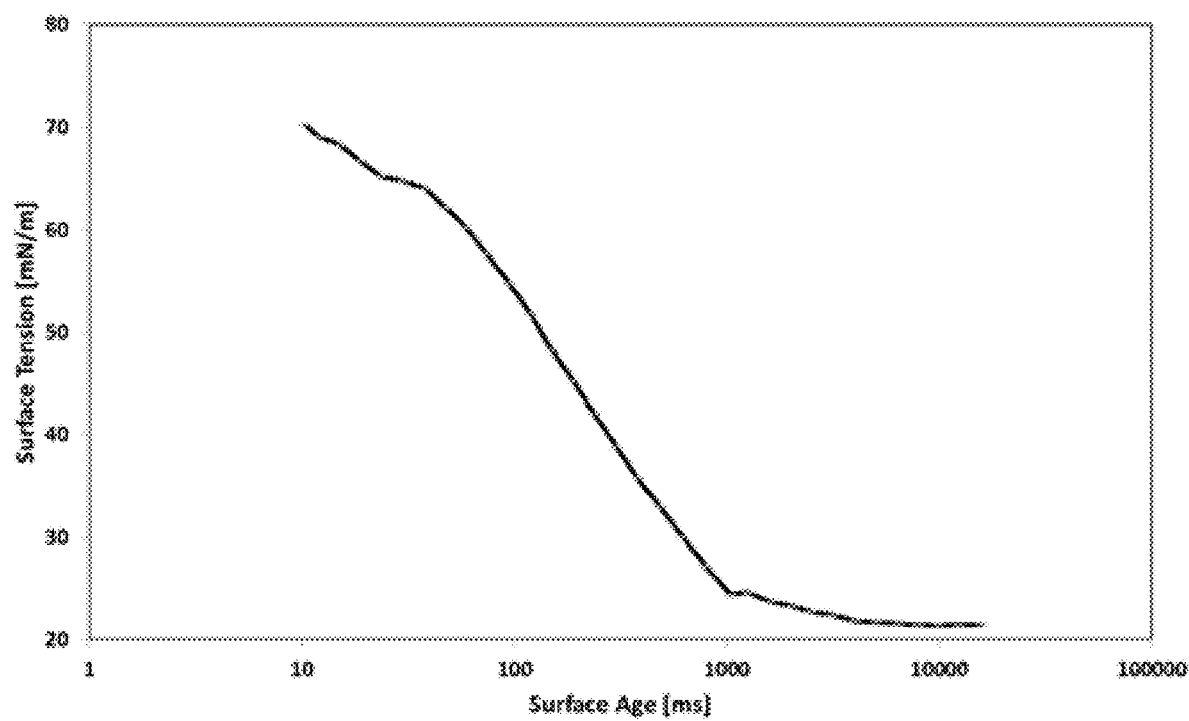
FIG. 5 shows a plot of dynamic surface tension as change in surface tension versus time for Surfactant 4 as described in Example 3b.

The dynamic surface tension of Surfactant 4 was determined with a bubble pressure tensiometer. FIG. 5 shows a plot of the results as surface tension versus time and demonstrates that Surfactant 4 fully saturated a freshly created air-water interface in one second or less, making it fast in terms of interfacial adsorption.

In addition to Surfactant 4's ability to lower both the interfacial and surface tension, formulations containing only Surfactant 4 in concentrations of 1-100×CMC have exceptional wetting properties. For example, a solution of Surfactant 4 in water at a concentration of 10×CMC exhibits a 0° contact angle on hydrophobic substrates such as polyethylene and polypropylene, and 10.6° on oleophobic and hydrophobic substrates such as Teflon. These contact angles are extremely low in comparison with the contact angle of water on the same substrate (Table 3).

TABLE 3

| Substrate | CA of Surfactant 4 (°) | Concentration | CA of water (°) |
|---|---|---|---|
| Teflon | 10.6 | 10x CMC | 119 |
| Polyethylene | 0 | 10x CMC | 91.5 |
| Polypropylene | 0 | 10x CMC | 93.3 |
| Nylon | 0 | 10x CMC | 50 |
| Polyethylene terephthalate | 0 | 10x CMC | 65.3 |

Example 4a

Synthesis of 4-((6-((3-(1,1,1,5,5,5-hexamethyl-3-((trimethylsilyl)oxy)trisiloxan-3-yl)propyl)amino)-6-oxohexyl)dimethylammonio)butane-1-sulfonate (Surfactant 5)

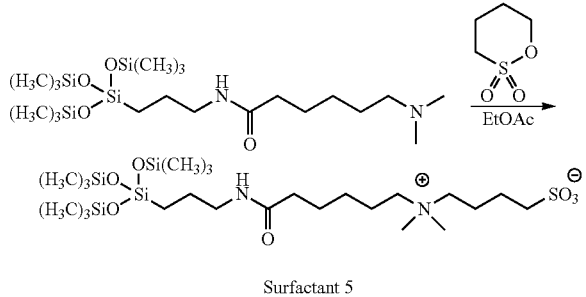

Surfactant 5

Surfactant 1 (1.00 g, 2.02 mmol, 1 equiv.) was added to ethyl acetate (EtOAc) (30 mL) in a 100 mL round bottom flask, followed by 1,2-butane sultone (0.27 mL, 2.2 mmol, 1.1 equiv.). The reaction was refluxed for 12 hours, after which the solvent was removed and the resultant white waxy solid was washed with acetone to give Surfactant 5 in 50% yield. $^1$H NMR (500 MHz, DMSO) δ 0.10 (s, 27H), 0.38-0.46 (m, 2H), 1.23-1.27 (m, 2H), 1.37-1.68 (m, 10H), 1.73-1.78 (m, 2H), 2.45-2.48 (m, 2H), 2.97-3.01 (m, 8H), 3.18-3.21 (m, 2H), 3.23-3.27 (m, 2H).

Example 4b

Determination of Physical Properties of Surfactant 5

Figure 6:
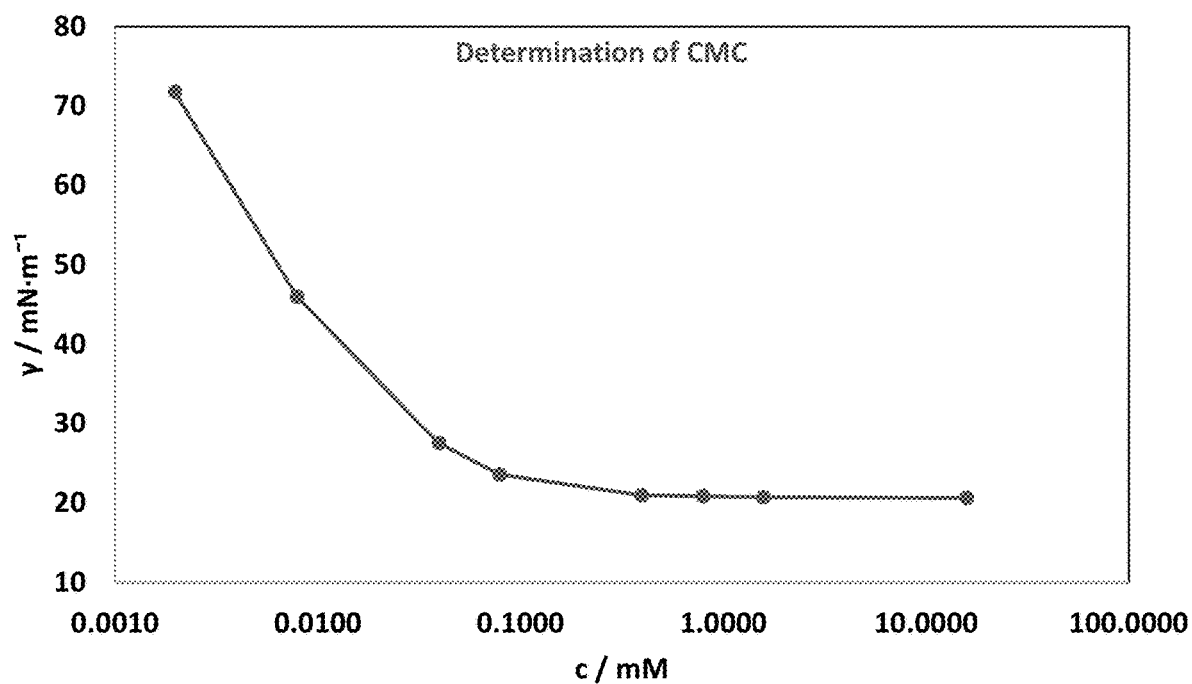
FIG. 6 shows a plot of surface tension versus concentration for Surfactant 5 as described in Example 4b.

The critical micelle concentration (CMC) for Surfactant 5 was measured. From the surface tension change with concentration in water, the CMC was determined to be about 0.39 mmol. The plateau value of minimum surface tension that can be reached by this surfactant is about 21 mN/m, indicating that the surfactant has outstanding interfacial activity. These results are plotted as surface tension versus concentration in FIG. 6.

Figure 7:
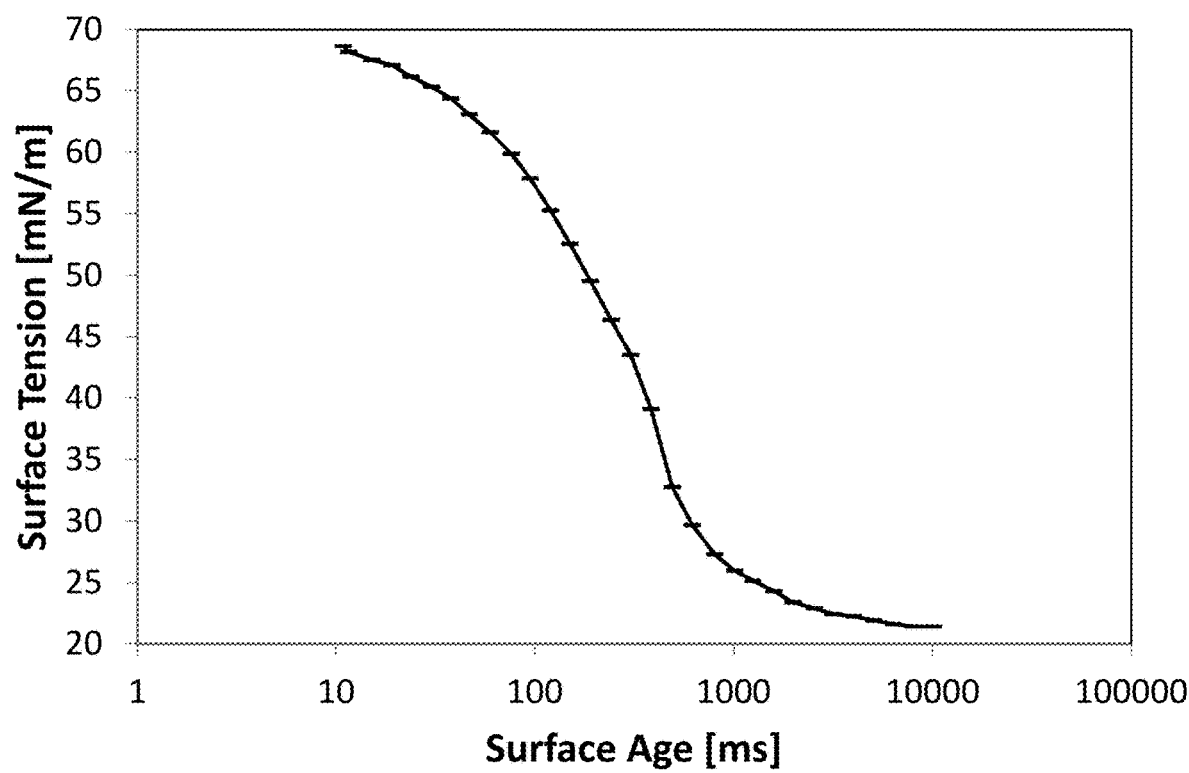
FIG. 7 shows a plot of dynamic surface tension as change in surface tension versus time for Surfactant 5 as described in Example 4b.

The dynamic surface tension of Surfactant 5 was determined with a bubble pressure tensiometer. FIG. 7 shows a plot of the results as surface tension versus time and demonstrates that Surfactant 5 fully saturated a freshly created air-water interface in one second or less, making it fast in terms of interfacial adsorption.

Finally, a solution of Surfactant 5 in water at a concentration of 10×CMC exhibits a 0° contact angle on hydrophobic substrates such as polyethylene and polypropylene, and 10.2° on oleophobic and hydrophobic substrates such as Teflon. These contact angles are extremely low in comparison with the contact angle of water on the same substrate (Table 4).

TABLE 4

| Substrate | CA of Surfactant 5 (°) | Concentration | CA of water (°) |
|---|---|---|---|
| Teflon | 10.2 | 10x CMC | 119 |
| Polyethylene | 0 | 10x CMC | 91.5 |
| Polypropylene | 0 | 10x CMC | 93.3 |
| Polyethylenterephthalate | 0 | 10x CMC | 65.3 |
| Nylon | 0 | 10x CMC | 50 |
| Polyethylene-HD | 0 | 10x CMC | 93.6 |

Example 5

Formulation for Pre-Texturing Agent

In this Example, a formulation for a pre-texturing agent is provided. The components of the formulation are shown below in Table 5.

TABLE 5

| Component | Function | Weight % |
|---|---|---|
| Surfactant | Wetting Agent | 0.01-30 |
| Oxalic Acid | Cleaning Agent | 0.1-30 |
| Water | | 60-99.89 |

Example 6

Formulation for Etchant

In this Example, a formulation for use as an etchant is provided. The formulation is shown below in Table 6.

TABLE 6

| Component | Function | Weight % |
|---|---|---|
| Hydrofluoric Acid | Etchant | 0.1-5 |
| Surfactant | Emulsifier | 0.0001-1 |
| Nitric Acid | Oxidizer | 0.01-0.5 |
| Oxalic Acid | Complexing Agent | 0.1-10 |
| Water | | 83.5-99.9 |

Example 7

Formulation for Photoresist Stripper

In this Example, a formulation for use as a photoresist stripper is provided. The formulation is shown below in Table 7.

TABLE 7

| Component | Function | Weight % |
|---|---|---|
| Alkanolamine | Stripping Agent | 5-15 |
| Sulfone | Dissolving Agent | 35-55 |
| Glycol Ether | Dissolving Agent | 35-55 |
| Surfactant | Cleaning Agent | 0.05-0.5 |

ASPECTS

Aspect 1 is a formulation for a pre-texturing agent, comprising: at least one surfactant of Formula I,

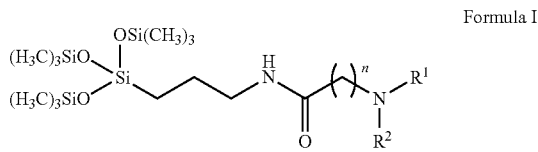

Formula I wherein $R^1$ and $R^2$ may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate; n is an integer from 1 to 12; the terminal nitrogen is optionally further substituted with $R^3$, wherein $R^3$ is selected from the group consisting of hydrogen, oxygen, hydroxyl, and $C_1$-$C_6$ alkyl; an optional counterion associated with the compound which, if present, is selected from the group consisting of chloride, bromide, and iodide; and at least one of one or more solvents and one or more defoaming agents.

Aspect 2 is a formulation for a pre-texturing agent, comprising: at least one surfactant of Formula I,

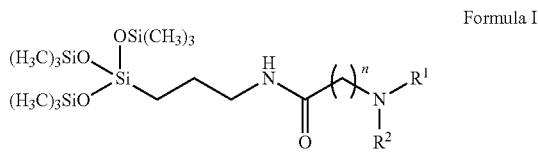

Formula I wherein $R^1$ and $R^2$ may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate; n is an integer from 1 to 12; the terminal nitrogen is optionally further substituted with $R^3$, wherein R³ is selected from the group consisting of hydrogen, oxygen, hydroxyl, and $C_1$-$C_6$ alkyl; an optional counterion associated with the compound which, if present, is selected from the group consisting of chloride, bromide, and iodide; and one or more solvents.

Aspect 3 is the formulation of Aspect 1 or Aspect 2, further comprising one or more acids.

Aspect 4 is the formulation of any of Aspects 1-3, further comprising one or more bases.

Aspect 5 is the formulation of any of Aspects 1-4, further comprising one or more chelating agents.

Aspect 6 is a formulation for a pre-texturing agent, comprising:

at least one surfactant of Formula I,

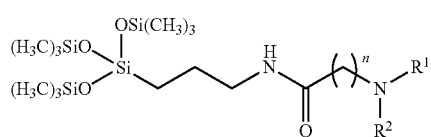

Formula I wherein R¹ and R² may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate; n is an integer from 1 to 12; the terminal nitrogen is optionally further substituted with R³, wherein R³ is selected from the group consisting of hydrogen, oxygen, hydroxyl, and $C_1$-$C_6$ alkyl; an optional counterion associated with the compound which, if present, is selected from the group consisting of chloride, bromide, and iodide; and one or more defoaming agents.

Aspect 7 is the formulation of Aspect 6, further comprising one or more acids.

Aspect 8 is the formulation of either Aspect 6 or Aspect 7, further comprising one or more bases.

Aspect 9 is the formulation of any of Aspects 6-8, further comprising one or more chelating agents.

Aspect 10 is the formulation of any of Aspects 6-9, further comprising one or more solvents.

Aspect 11 is a formulation for an etchant, comprising: at least one surfactant of Formula I,

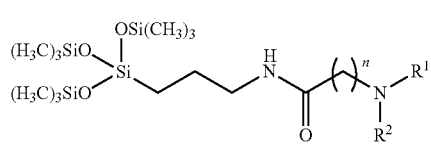

Formula I wherein R¹ and R² may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate; n is an integer from 1 to 12; the terminal nitrogen is optionally further substituted with R³, wherein R³ is selected from the group consisting of hydrogen, oxygen, hydroxyl, and $C_1$-$C_6$ alkyl; an optional counterion associated with the compound which, if present, is selected from the group consisting of chloride, bromide, and iodide; and hydrofluoric acid (HF).

Aspect 12 is the formulation of Aspect 11, further comprising one or more oxidizing agents.

Aspect 13 is the formulation of either Aspect 11 or Aspect 12, further comprising one or more complexing agents.

Aspect 14 is a formulation for a photoresist stripping formulation, comprising: at least one surfactant of Formula I,

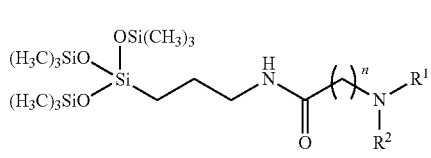

Formula I wherein R¹ and R² may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate; n is an integer from 1 to 12; the terminal nitrogen is optionally further substituted with R³, wherein R³ is selected from the group consisting of hydrogen, oxygen, hydroxyl, and $C_1$-$C_6$ alkyl; an optional counterion associated with the compound which, if present, is selected from the group consisting of chloride, bromide, and iodide; and an alkanolamine.

Aspect 15 is the formulation of Aspect 14, further comprising a sulfoxide.

Aspect 16 is the formulation of Aspect 15, further comprising a sulfone.

Aspect 17 is the formulation of any of Aspects 14-16, further comprising a glycol ether.

The invention claimed is:

1. A formulation for an etchant, comprising:
   at least one surfactant of Formula I,

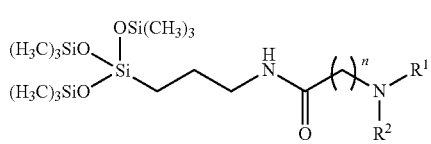

Formula I wherein R¹ and R² may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate;

n is an integer from 1 to 12;

the terminal nitrogen is optionally further substituted with R³, wherein R³ is selected from the group consisting of hydrogen, oxygen, hydroxyl, and $C_1$-$C_6$ alkyl;

an optional counterion associated with the compound which, if present, is selected from the group consisting of chloride, bromide, and iodide; and hydrofluoric acid (HF).

2. The formulation of claim 1, further comprising one or more oxidizing agents.

3. The formulation of claim 1, further comprising one or more complexing agents.

4. The formulation of claim 1, wherein n is 5.

5. The formulation of claim 1, wherein the surfactant is 6-(dimethylamino)-N-(3-(1,1,1,5,5,5-hexamethyl-3-((trimethylsilyl)oxy)trisiloxan-3-yl)propyl)hexanamide, having the following formula:

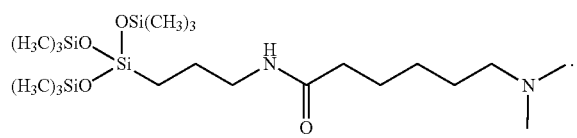

6. The formulation of claim 1, wherein the surfactant is 6-(dimethylamino)-N-(3-(1,1,1,5,5,5-hexamethyl-3-((trimethylsilyl)oxy)trisiloxan-3-yl)propyl)hexaminium chloride, having the following formula:

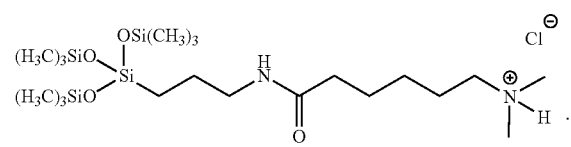

7. The formulation of claim 1, wherein the surfactant is 3 6-((3-(1,1,1,5,5,5-hexamethyl-3-((trimethylsilyl)oxy)trisiloxan-3-yl)propyl)amino)-N,N,N-trimethyl-6-oxohexan-1-aminium iodide, having the following formula:

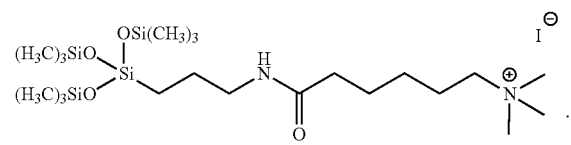

8. The formulation of claim 1, wherein the surfactant is 6-((3-(1,1, 1,5,5,5-hexamethyl-3-((trimethylsilyl)oxy)trisiloxan-3-yl)propyl)amino)-N,N-dimethyl-6-oxohexan-1-amine oxide, having the following formula:

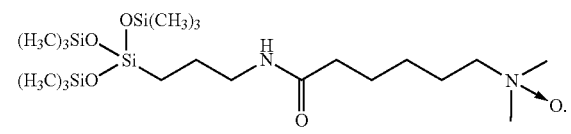

9. The formulation of claim 1, wherein the surfactant is 4-((6-((3-(1,1, 1,5,5,5-hexamethyl-3-((trimethylsilyl)oxy)trisiloxan-3-yl)propyl)amino)-6-oxohexyl)dimethylammonio)butane-1-sulfonate, having the following formula:

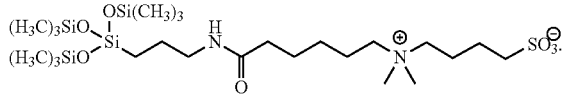

10. A formulation for a photoresist stripping formulation, comprising:
at least one surfactant of Formula I,

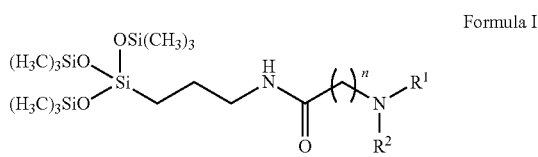

Formula I wherein $R^1$ and $R^2$ may be the same or different, and comprise at least one group selected from the group consisting of $C_1$-$C_6$ alkyl, optionally the $C_1$-$C_6$ alkyl may include one or more of oxygen, nitrogen, or sulfur atoms or groups that include at least one of these atoms, and the alkyl chain may be optionally substituted with one or more substituents selected from the group consisting of hydroxyl, amino, amido, sulfonyl, sulfonate, carbonyl, carboxyl, and carboxylate;
n is an integer from 1 to 12;
the terminal nitrogen is optionally further substituted with $R^3$, wherein $R^3$ is selected from the group consisting of hydrogen, oxygen, hydroxyl, and $C_1$-$C_6$ alkyl;
an optional counterion associated with the compound which, if present, is selected from the group consisting of chloride, bromide, and iodide; and
an alkanolamine.

11. The formulation of claim 10, further comprising a sulfoxide.

12. The formulation of claim 10, further comprising a sulfone.

13. The formulation of claim 10, further comprising a glycol ether.

14. The formulation of claim 10, wherein n is 5.

15. The formulation of claim 10, wherein the surfactant is 6-(dimethylamino)-N-(3-(1,1,1,5,5,5-hexamethyl-3-((trimethylsilyl)oxy)trisiloxan-3-yl)propyl)hexanamide, having the following formula:

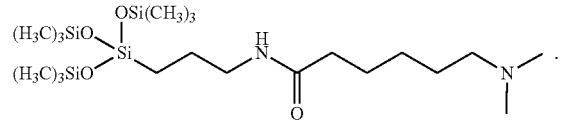

16. The formulation of claim 10, wherein the surfactant is 6-(dimethylamino)-N-(3-(1,1,1,5,5,5-hexamethyl-3-((trimethylsilyl)oxy)trisiloxan-3-yl)propyl)hexaminium chloride, having the following formula:

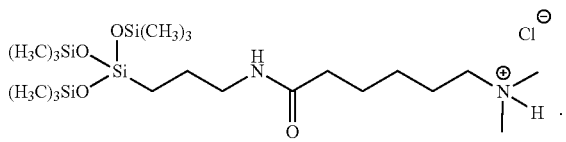

17. The formulation of claim 10, wherein the surfactant is 6-((3-(1,1,1,5,5,5-hexamethyl-3-((trimethylsilyl)oxy)trisiloxan-3-yl)propyl)amino)-N,N,N-trimethyl-6-oxohexan-1-aminium iodide, having the following formula:

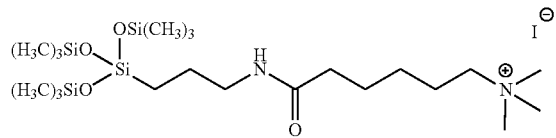

18. The formulation of claim 10, wherein the surfactant is 6-((3-(1,1,1,5,5,5-hexamethyl-3-((trimethylsilyl)oxy)trisiloxan-3-yl)propyl)amino)-N,N-dimethyl-6-oxohexan-1-amine oxide, having the following formula:

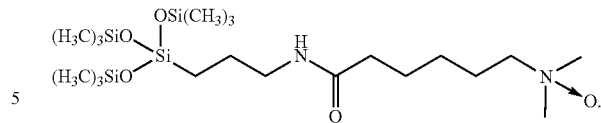

19. The formulation of claim 10, wherein the surfactant is 4-((6-((3-(1,1,1,5,5,5-hexamethyl-3-((trimethylsilyl)oxy)trisiloxan-3-yl)propyl)amino)-6-oxohexyl)dimethylammonio)butane-1-sulfonate, having the following formula:

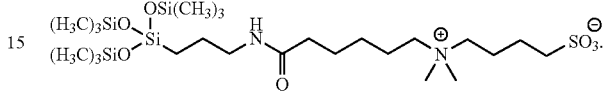

* * * * *